US012707744B2

(12) United States Patent
Shirahige et al.

(10) Patent No.: US 12,707,744 B2
(45) Date of Patent: Aug. 11, 2026

(54) PHOTOELECTRIC CONVERSION ELEMENT AND PHOTOELECTRIC CONVERSION DEVICE

(71) Applicant: CANON KABUSHIKI KAISHA, Tokyo (JP)

(72) Inventors: Daiki Shirahige, Kanagawa (JP); Yu Maehashi, Hokkaido (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 368 days.

(21) Appl. No.: 18/459,532

(22) Filed: Sep. 1, 2023

(65) Prior Publication Data

US 2024/0088186 A1 Mar. 14, 2024

(30) Foreign Application Priority Data

Sep. 8, 2022 (JP) ................................ 2022-142829

(51) Int. Cl.
*H10F 39/00* (2025.01)
*H10F 39/18* (2025.01)

(52) U.S. Cl.
CPC ....... *H10F 39/8063* (2025.01); *H10F 39/182* (2025.01)

(58) Field of Classification Search
CPC .......................... H10F 30/225; H10F 30/2255
See application file for complete search history.

(56) References Cited

U.S. PATENT DOCUMENTS

| | | | |
|---|---|---|---|
| 8,598,901 | B2 | 12/2013 | Hiyama |
| 8,711,259 | B2 | 4/2014 | Maehashi |
| 9,407,847 | B2 | 8/2016 | Maehashi |
| 9,762,840 | B2 | 9/2017 | Yamazaki |
| 9,986,194 | B2 | 5/2018 | Maehashi |

(Continued)

FOREIGN PATENT DOCUMENTS

| | | |
|---|---|---|
| JP | 2019-102675 A | 6/2019 |
| JP | 2020-155514 A | 9/2020 |

(Continued)

OTHER PUBLICATIONS

Japanese office action issued Jun. 11, 2026 during prosecution of corresponding Japanese application No. 2022-142829 (English-language machine translation included).

*Primary Examiner* — Benjamin P Sandvik
(74) *Attorney, Agent, or Firm* — VENABLE LLP

(57) ABSTRACT

A photoelectric conversion element includes in a semiconductor layer a first semiconductor region arranged, a second semiconductor region arranged on a second face side closer than the first semiconductor region and forming a p-n junction with the first semiconductor region to form an avalanche photodiode, a light guide structure including a first portion surrounding a first region and a second portion surrounding a second region inside the first region in a plan view, and an optical structure layer disposed on the second face side. The second portion is disposed over a depth of at least 0.8 μm from the second face, the first and second semiconductor regions are arranged closer to the first face than the second portion, and the second portion overlaps at least a portion of an avalanche multiplication region between the first and second semiconductor region in the plan view.

21 Claims, 29 Drawing Sheets

(56) References Cited

U.S. PATENT DOCUMENTS

| | | | | |
|---|---|---|---|---|
| 10,971,539 | B2 | 4/2021 | Maehashi | |
| 11,057,551 | B2 | 7/2021 | Nishide | |
| 11,240,453 | B2 | 2/2022 | Maehashi | |
| 11,706,518 | B2 | 7/2023 | Nishide | |
| 2020/0135776 | A1 | 4/2020 | Finkelstein | |
| 2021/0013250 | A1* | 1/2021 | Shim | H10F 39/014 |
| 2022/0181374 | A1 | 6/2022 | Ito et al. | |
| 2022/0293457 | A1* | 9/2022 | Chou | H10W 10/014 |
| 2022/0336504 | A1* | 10/2022 | Kitano | H10F 39/014 |
| 2023/0053980 | A1 | 2/2023 | Shirahige | |
| 2023/0115792 | A1 | 4/2023 | Maehashi | |
| 2023/0268365 | A1* | 8/2023 | Kurata | H10F 39/8067 257/432 |
| 2023/0269457 | A1 | 8/2023 | Nishide | |

FOREIGN PATENT DOCUMENTS

| | | | |
|---|---|---|---|
| JP | 2022-47438 | A | 3/2022 |
| WO | 2020/170841 | A | 8/2020 |
| WO | 2020/203250 | A | 10/2020 |

* cited by examiner

FIG. 5A
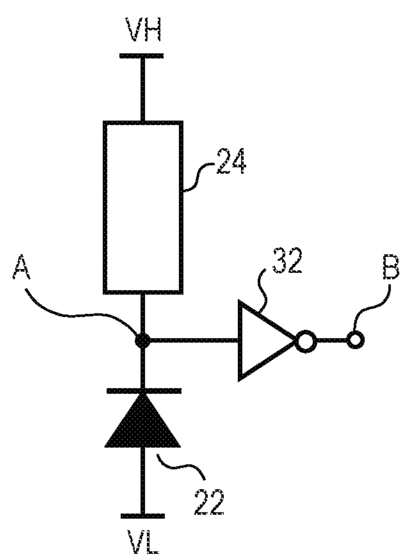
FIG. 5B
FIG. 5C
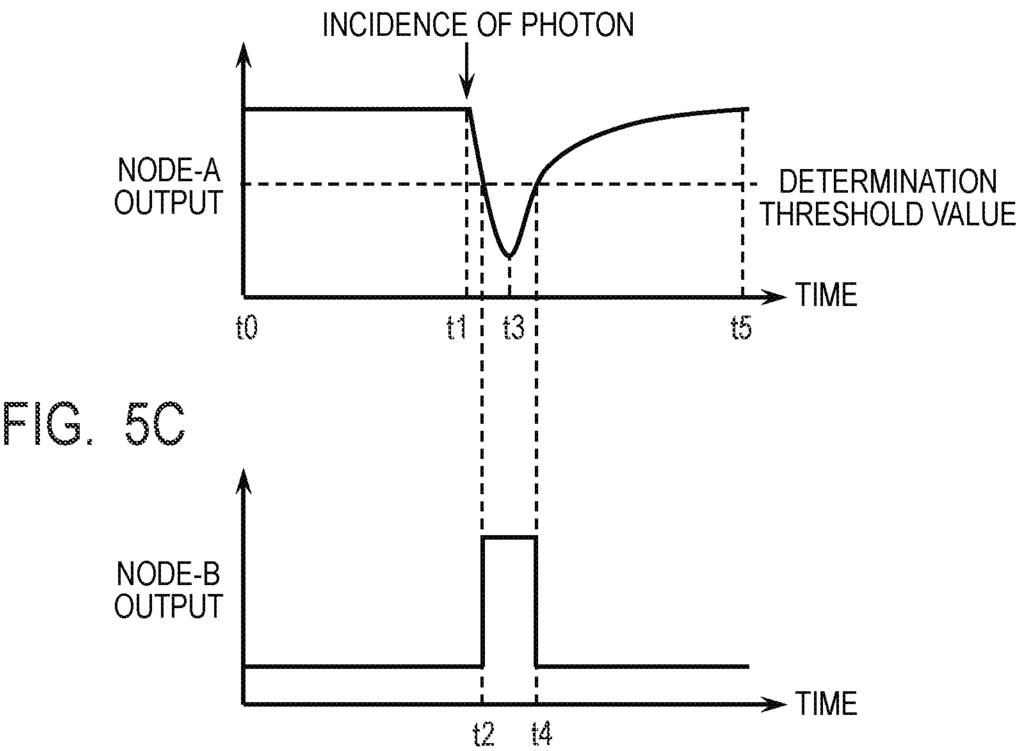

VI
VI'
134
144
132
138
146
128
126
158
196
130
194
192
124
136
122
152
170
190
120
110
150
180
156
160
182
184
154

IX
IX'
190
120
150
180
110
194
192
124
136
122
152
170
144
134
130
196
158
126
128
148
146
138
132
156
160
154
184
182

XI
XI'
190
120
150
180
110
194
192
124
136
122
152
170
144
134
130
196
158
126
128
148
146
138
132
156
160
154
184
182

XIII
XIII'
144
134
136
128
126
158
196
130
190
194
192
124
120
110
122
150
152
170
180
156
160
182
184
154

Figure 23:
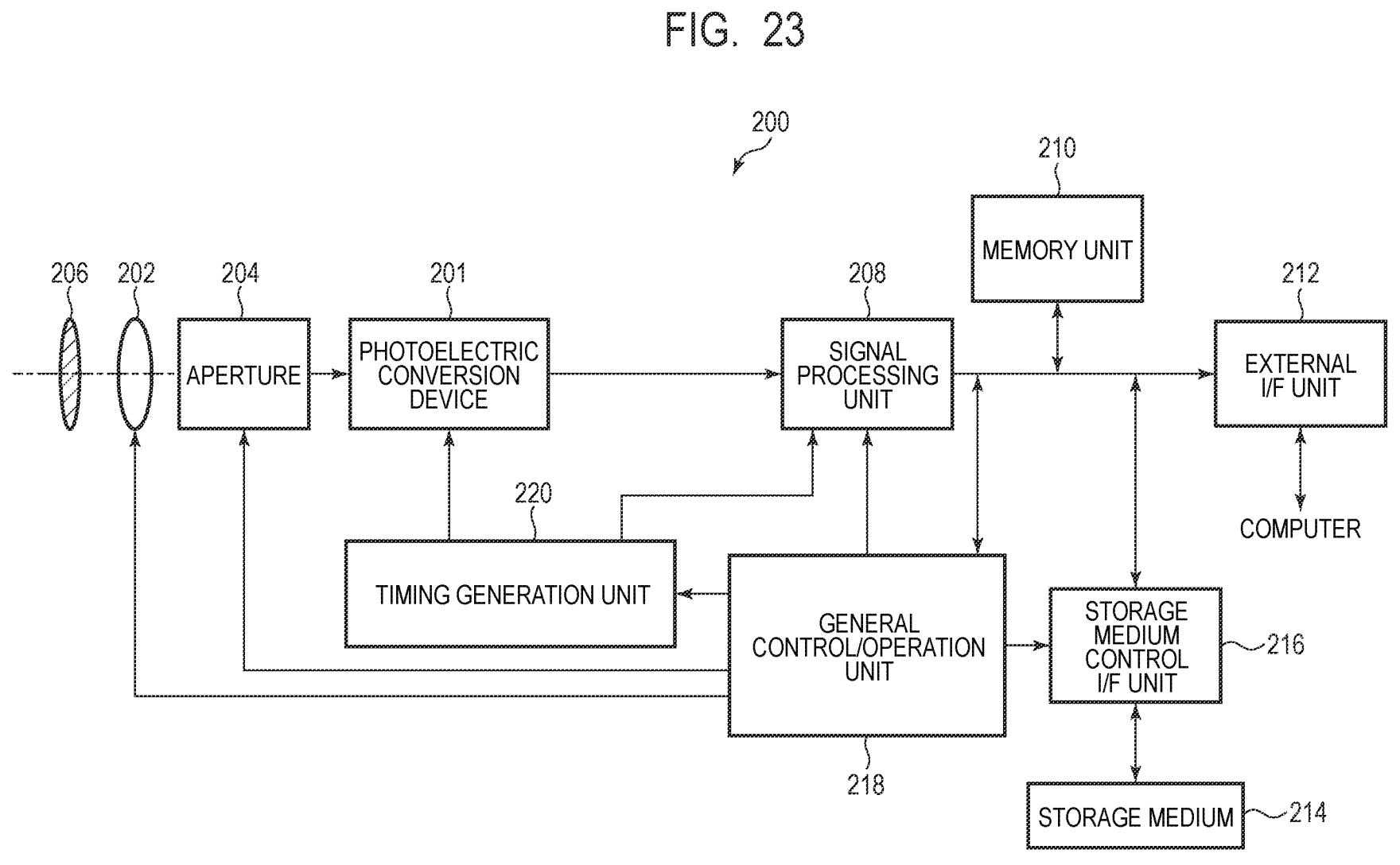

204 APERTURE

201 PHOTOELECTRIC CONVERSION DEVICE

220 TIMING GENERATION UNIT

208 SIGNAL PROCESSING UNIT

218 GENERAL CONTROL/OPERATION UNIT

210 MEMORY UNIT

212 EXTERNAL I/F UNIT

COMPUTER

216 STORAGE MEDIUM CONTROL I/F UNIT

214 STORAGE MEDIUM

Figure 24:
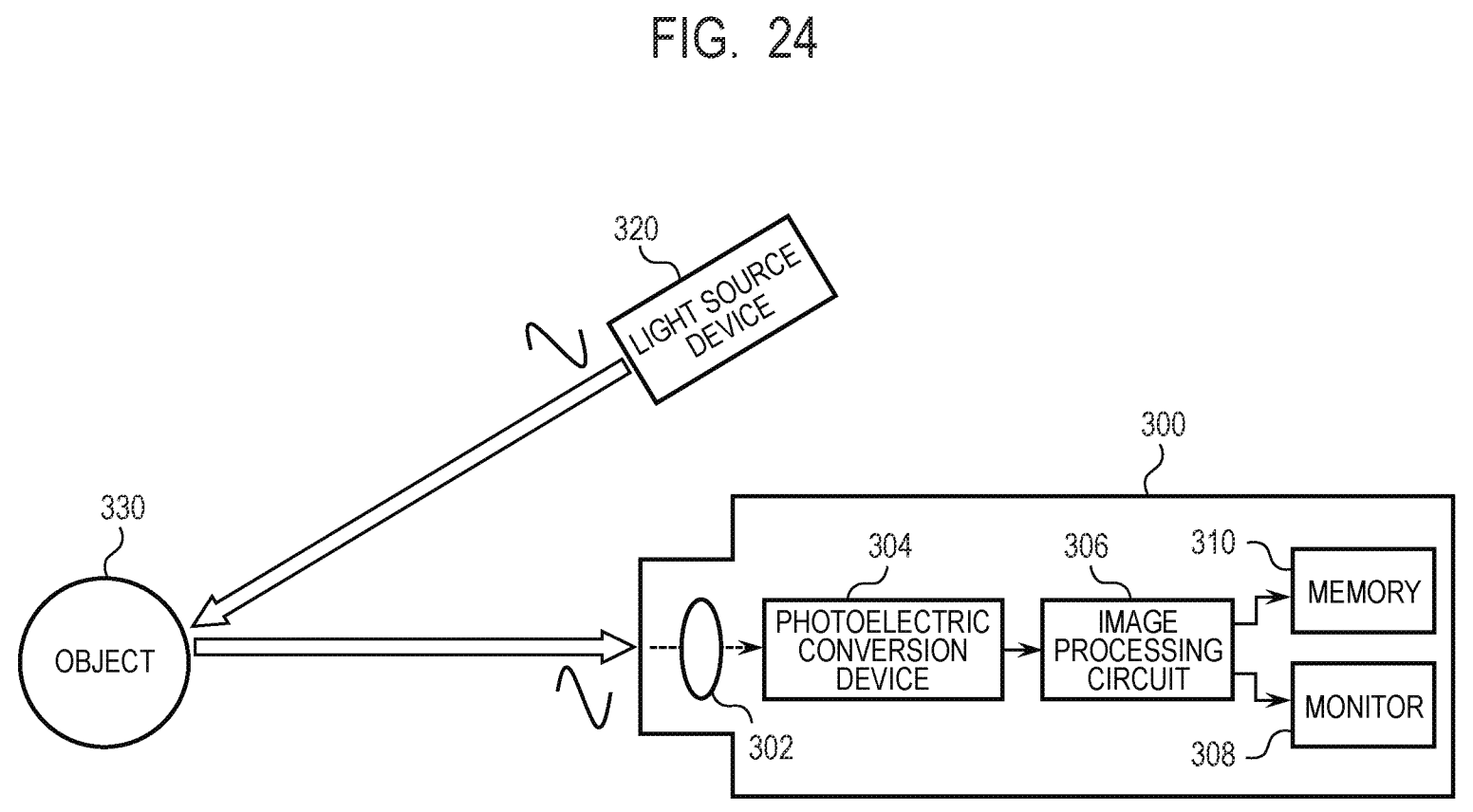

MEMORY

MONITOR

310

308

IMAGE PROCESSING CIRCUIT

306

PHOTOELECTRIC CONVERSION DEVICE

304

302

LIGHT SOURCE DEVICE

320

OBJECT

330

PHOTOELECTRIC CONVERSION ELEMENT AND PHOTOELECTRIC CONVERSION DEVICE

BACKGROUND

Field of the Disclosure

The present disclosure relates to a photoelectric conversion element and a photoelectric conversion device.

Description of the Related Art

As a photoelectric conversion element, there is known an avalanche photodiode (hereinafter referred to as "APD") that multiplies charges generated by incidence of photons by avalanche breakdown. Japanese Patent Application Laid-Open No. 2020-155514 discloses a technology for improving characteristics of a photoelectric conversion element by devising a structure of a light collecting portion for collecting incident light toward an APD.

In order to improve the sensitivity of the photoelectric conversion element, it is important to efficiently guide charges generated by the photoelectric conversion to the avalanche multiplication region. However, the technology described in Japanese Patent Application Laid-Open No. 2020-155514 is not necessarily sufficient for guiding charges generated by photoelectric conversion to the avalanche multiplication region.

SUMMARY

An object of the present disclosure is to provide a photoelectric conversion element and a photoelectric conversion device capable of efficiently guiding charges generated by photoelectric conversion to an avalanche multiplication region and improving light receiving sensitivity.

According to an embodiment of the present disclosure, there is provided a photoelectric conversion element provided in a semiconductor layer having a first face and a second face opposed to the first face including a first semiconductor region of a first conductivity type arranged in the semiconductor layer, a second semiconductor region of a second conductivity type arranged closer to the second face than the first semiconductor region and forming a p-n junction with the first semiconductor region to form an avalanche photodiode, a light guide structure arranged in the semiconductor layer and having a first portion disposed so as to surround a first region in a plan view and a second portion disposed so as to surround a second region inside the first region in the plan view, and an optical structure layer disposed on a side of the second face of the semiconductor layer, wherein the second portion is disposed over a depth of at least 0.8 μm from the second face, wherein the first semiconductor region and the second semiconductor region are arranged closer to the first face than the second portion, and wherein the second portion overlaps at least a portion of an avalanche multiplication region between the first semiconductor region and the second semiconductor region in the plan view.

According to another embodiment of the present specification, there is provided a photoelectric conversion element provided in a semiconductor layer having a first face and a second face opposed to the first face including a first semiconductor region of a first conductivity type arranged in the semiconductor layer, a second semiconductor region of a second conductivity type arranged closer to the second face than the first semiconductor region and forming a p-n junction with the first semiconductor region to form an avalanche photodiode, a light guide structure arranged in the semiconductor layer and disposed so as to surround a region where the avalanche photodiode is provided, and an optical structure layer disposed on a side of the second face of the semiconductor layer, wherein, in a cross-sectional view, the light guide structure has a second width of a second portion on a side of the second face larger than a first width of a first portion on a side of the first face, and a width of the light guide structure is changed discontinuously from the first width to the second width.

Further features of the present disclosure will become apparent from the following description of exemplary embodiments with reference to the attached drawings.

BRIEF DESCRIPTION OF THE DRAWINGS

FIG. 5A, FIG. 5B, and FIG. 5C are diagrams illustrating the basic operation of the photoelectric conversion unit in the photoelectric conversion device according to the first embodiment of the present disclosure.

FIG. 22 is a schematic cross-sectional view illustrating a structure of the photoelectric conversion element in the photoelectric conversion device according to the ninth embodiment of the present disclosure.

FIG. 23 is a block diagram illustrating a schematic configuration of a photodetection system according to a tenth embodiment of the present disclosure.

FIG. 24 is a block diagram illustrating a schematic configuration of a range image sensor according to an eleventh embodiment of the present disclosure.

DESCRIPTION OF THE EMBODIMENTS

Figure 1:
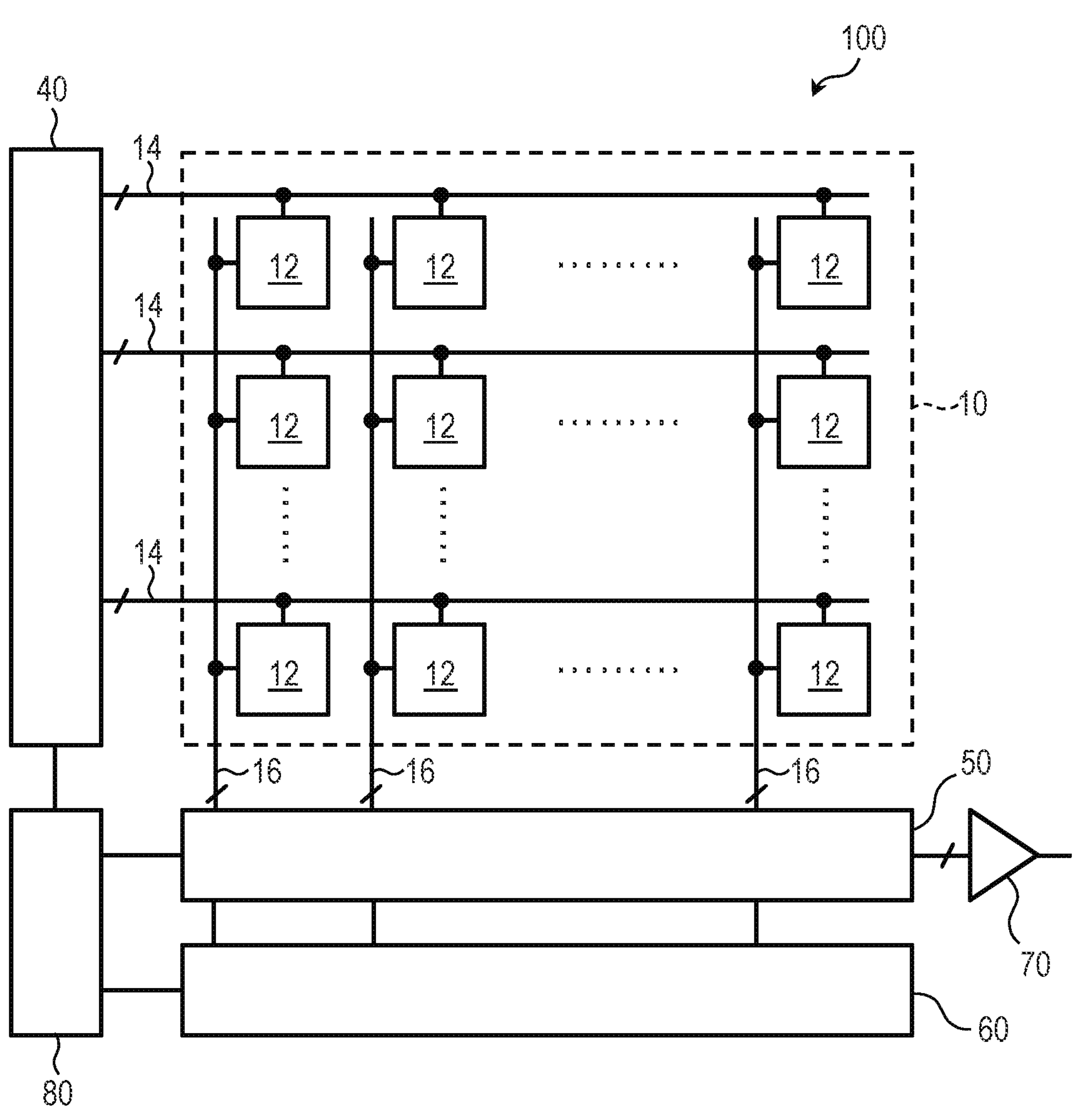
FIG. 1 and FIG. 2 are block diagrams illustrating a schematic configuration of a photoelectric conversion device according to a first embodiment of the present disclosure.

Preferred embodiments of the present disclosure will now be described in detail in accordance with the accompanying drawings.

The following embodiments are intended to embody the technical idea of the present disclosure and do not limit the present disclosure. The sizes and positional relationships of the members illustrated in the drawings may be exaggerated for clarity of explanation. In the following description, the same components are denoted by the same reference numerals, and description thereof may be omitted.

First Embodiment

Figure 2:
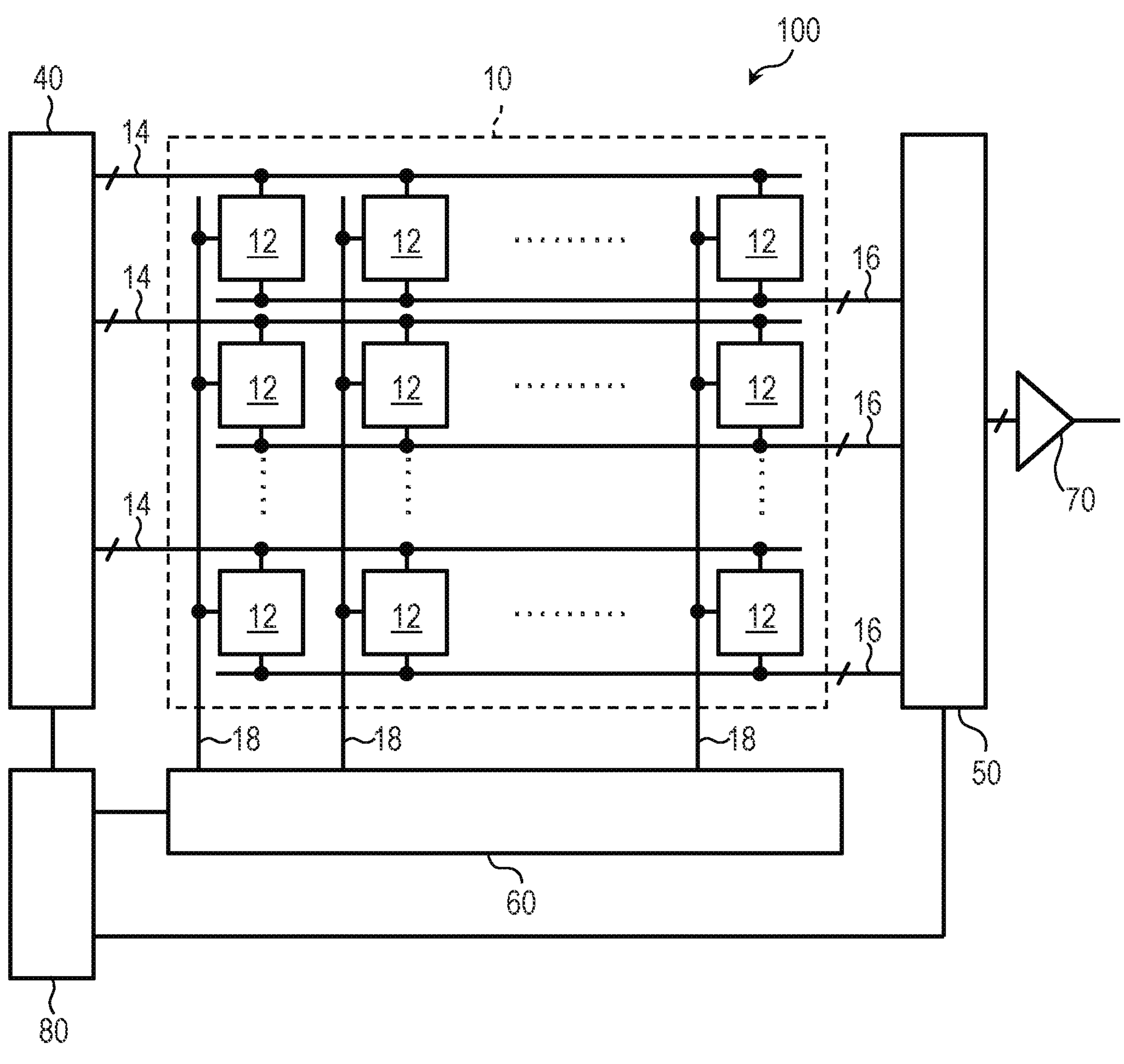
Figure 3:
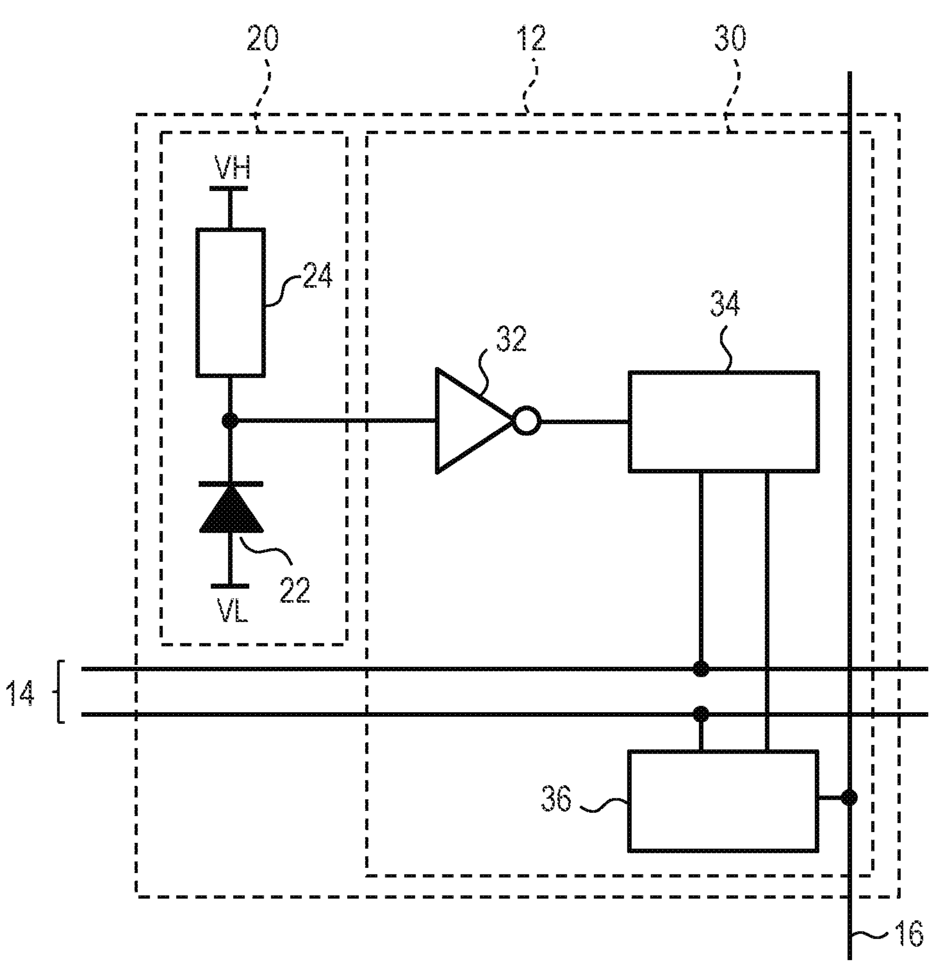
FIG. 3 is a block diagram illustrating a configuration example of a pixel of the photoelectric conversion device according to the first embodiment of the present disclosure.
Figure 4:
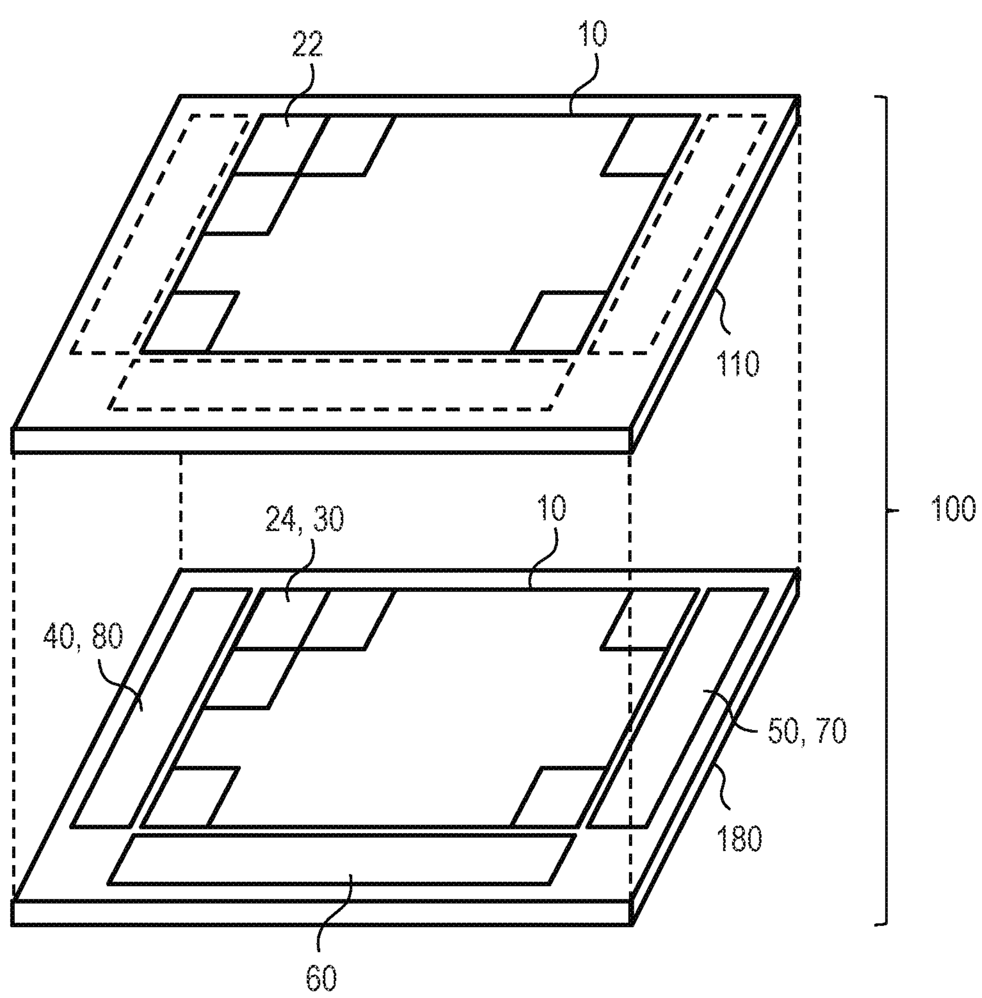
FIG. 4 is a perspective view illustrating a configuration example of the photoelectric conversion device according to the first embodiment of the present disclosure.

A schematic configuration of a photoelectric conversion device according to a first embodiment of the present disclosure will be described with reference to FIGS. 1 to 4. FIG. 1 and FIG. 2 are block diagrams illustrating a schematic configuration of a photoelectric conversion device according to the present embodiment. FIG. 3 is a block diagram illustrating a configuration example of a pixel of the photoelectric conversion device according to the present embodiment. FIG. 4 is a perspective view illustrating a configuration example of the photoelectric conversion device according to the present embodiment.

As illustrated in FIG. 1, the photoelectric conversion device 100 according to the present embodiment includes a pixel region 10, a vertical scanning circuit unit 40, a readout circuit unit 50, a horizontal scanning circuit unit 60, an output circuit unit 70, and a control pulse generation unit 80.

The pixel region 10 includes a plurality of pixels 12 arranged in an array so as to form a plurality of rows and a plurality of columns. Each pixel 12 may include a photoelectric conversion unit including a photoelectric conversion element and a pixel signal processing unit that processes a signal output from the photoelectric conversion unit, as will be described later. The number of pixels 12 constituting the pixel region 10 is not particularly limited. For example, the pixel region 10 may be constituted by a plurality of pixels 12 arranged in an array of several thousands of rows and several thousands of columns as in a general digital camera. Alternatively, the pixel region 10 may be composed of a plurality of pixels 12 arranged in one row or one column. Alternatively, one pixel 12 may constitute the pixel region 10.

In each row of the pixel array of the pixel region 10, a control line 14 is arranged so as to extend in a first direction (lateral direction in FIG. 1). Each of the control lines 14 is connected to the pixels 12 arranged in the first direction on the corresponding row, and serves as a signal line common to these pixels 12. The first direction in which the control lines 14 extend may be referred to as a row direction or a horizontal direction. Each of the control lines 14 may include a plurality of signal lines for supplying a plurality of types of control signals to the pixels 12.

In addition, in each column of the pixel array of the pixel region 10, a data line 16 is arranged so as to extend in a second direction (vertical direction in FIG. 1) intersecting with the first direction. Each of the data lines 16 is connected to the pixels 12 arranged in the second direction on the corresponding column, and serves as a signal line common to these pixels 12. The second direction in which the data lines 16 extend may be referred to as a column direction or a vertical direction. Each of the data lines 16 may include a plurality of signal lines for transferring a digital signal of a plurality of bits output from the pixel 12 bit by bit.

The control line 14 in each row is connected to the vertical scanning circuit unit 40. The vertical scanning circuit unit 40 is a control unit having a function of receiving a control signal output from the control pulse generation unit 80, generating a control signal for driving the pixels 12, and supplying the generated control signal to the pixels 12 via the control line 14. A logic circuit such as a shift register or an address decoder may be used for the vertical scanning circuit unit 40. The vertical scanning circuit unit 40 sequentially scans the pixels 12 in the pixel region 10 in units of rows to thereby output pixel signals of the pixels 12 from the pixel region 10 to the readout circuit unit 50 via the data lines 16.

The data line 16 in each column is connected to the readout circuit unit 50. The readout circuit unit 50 includes a plurality of holding units (not illustrated) provided corresponding to each column of the pixel array of the pixel region 10, and has a function of holding the pixel signals of the pixels 12 of each column output from the pixel region 10 in units of rows via the data lines 16 in the holding units of the corresponding columns.

The horizontal scanning circuit unit 60 is a control unit having a function of receiving a control signal output from the control pulse generation unit 80, generates a control signal for reading out the pixel signal from the holding unit of each column of the readout circuit unit 50, and supplies the generated control signal to the readout circuit unit 50. A logic circuit such as a shift register or an address decoder may be used for the horizontal scanning circuit unit 60. The horizontal scanning circuit unit 60 sequentially scans the holding units of the respective columns of the readout circuit unit 50, and sequentially outputs the pixel signals held in the respective columns to the output circuit unit 70.

The output circuit unit 70 includes an external interface circuit, and outputs the pixel signals output from the readout circuit unit 50 to the outside of the photoelectric conversion device 100. The external interface circuit included in the output circuit unit 70 is not particularly limited. For example, SerDes (SERializer/DESerializer) transmission circuits such as LVDS (Low Voltage Differential Signaling) circuit and SLVS (Scalable Low Voltage Signaling) circuit may be applied to the external interface circuit.

The control pulse generation unit 80 is a control circuit for generating control signals for controlling the operation and timing of the vertical scanning circuit unit 40, the readout circuit unit 50, and the horizontal scanning circuit unit 60, and supplying the control signal to each functional block. At least a part of the control signals for controlling the operation and timing of the vertical scanning circuit unit 40, the readout circuit unit 50, and the horizontal scanning circuit unit 60 may be supplied from the outside of the photoelectric conversion device 100.

The connection mode of each functional block of the photoelectric conversion device 100 is not limited to the configuration example illustrated in FIG. 1, and may be configured as illustrated in FIG. 2, for example.

In the configuration example of FIG. 2, the data line 16 extending in the first direction is arranged in each row of the pixel array of the pixel region 10. Each of the data lines 16 is connected to the pixels 12 arranged in the first direction on the corresponding row, and serves as a signal line common to these pixels 12. In addition, a control line 18 extending in the second direction is arranged in each column of the pixel array of the pixel region 10. Each of the control lines 18 is connected to the pixels 12 arranged in the second direction on the corresponding column, and serves as a signal line common to these pixels 12.

The control line 18 in each column is connected to the horizontal scanning circuit unit 60. The horizontal scanning circuit unit 60 receives a control signal output from the control pulse generation unit 80, generates a control signal for reading out the pixel signals from the pixels 12, and supplies the generated control signal to the pixels 12 via the control line 18. Specifically, the horizontal scanning circuit unit 60 sequentially scans the plurality of pixels 12 in the pixel region 10 in units of columns to thereby output pixel signals of the pixels 12 in each row belonging to the selected column to the data lines 16.

The data line 16 of each row is connected to the readout circuit unit 50. The readout circuit unit 50 includes a plurality of holding units (not illustrated) provided corresponding to each row of the pixel array of the pixel region 10, and has a function of holding the pixel signals of the pixels 12 of each row output from the pixel region 10 in units of columns via the data lines 16 in the holding units of the corresponding rows.

The readout circuit unit 50 receives the control signal output from the control pulse generation unit 80, and sequentially outputs the pixel signals held in the holding units of the respective rows to the output circuit unit 70.

Other configurations in the configuration example of FIG. 2 may be similar to those in the configuration example of FIG. 1.

As illustrated in FIG. 3, each pixel 12 may include a photoelectric conversion unit 20 and a pixel signal processing unit 30. The photoelectric conversion unit 20 includes a photoelectric conversion element 22 and a quenching element 24. The pixel signal processing unit 30 includes a signal processing circuit 32, a counter 34, and a pixel output circuit 36.

The photoelectric conversion element 22 may be an avalanche photodiode (hereinafter referred to as "APD"). An anode of the APD constituting the photoelectric conversion element 22 is connected to a node to which a voltage VL is supplied. A cathode of the APD constituting the photoelectric conversion element 22 is connected to one terminal of the quenching element 24. A connection node between the photoelectric conversion element 22 and the quenching element 24 is an output node of the photoelectric conversion unit 20. The other terminal of the quenching element 24 is connected to a node to which a voltage VH higher than the voltage VL is supplied. The voltage VL and the voltage VH are set such that a reverse bias voltage sufficient for the APD to perform the avalanche multiplication operation is applied. In one example, a negative high voltage is applied as the voltage VL, and a positive voltage about a power supply voltage is applied as the voltage VH. For example, the voltage VL is −30 V and the voltage VH is 1 V.

The photoelectric conversion element 22 may be formed of APD as described above. By supplying a reverse bias voltage sufficient to perform the avalanche multiplication operation to the APD, charge generated by light incidence to the APD causes avalanche multiplication, and an avalanche current is generated. The operation modes in a state where a reverse bias voltage is supplied to the APD include a Geiger mode and a linear mode. The Geiger mode is an operation mode in which a voltage applied between the anode and the cathode is set to a reverse bias voltage larger than a breakdown voltage of the APD. The linear mode is an operation mode in which a voltage applied between an anode and a cathode is set to a reverse bias voltage close to or lower than a breakdown voltage of the APD. The APD operating in the Geiger mode is called SPAD (Single Photon Avalanche Diode). The APD constituting the photoelectric conversion element 22 may operate in the linear mode or the Geiger mode.

In the present embodiment, the anode of the APD is set to a fixed potential, and a signal is extracted from the cathode side. Therefore, a semiconductor region of a first conductivity type in which a charge having the same polarity as the signal charge is a majority carrier is an n-type semiconductor region, and a semiconductor region of a second conductivity type in which a charge having a polarity different from the signal charge is a majority carrier is a p-type semiconductor region. The carriers of the first conductivity type are electrons, and the carriers of the second conductivity type are holes. Note that the present disclosure is also true even when the cathode of the APD is set to a fixed potential and a signal is extracted from the anode side. In this case, a semiconductor region of a first conductivity type in which a charge having the same polarity as the signal charge is a majority carriers is a p-type semiconductor region, and a semiconductor region of a second conductivity type in which a charge having a polarity different from the signal charge is a majority carriers is an n-type semiconductor region. Although the case where one node of the APD is set to a fixed potential is described below, potentials of both nodes may be varied.

In this specification, when the term "impurity concentration" is used, it means a net impurity concentration obtained by subtracting the amount compensated by the impurity of the opposite conductivity type. That is, the "impurity concentration" refers to a net doping concentration. A region where the p-type impurity concentration is higher than the n-type impurity concentration is a p-type semiconductor region. Conversely, a region where the n-type impurity concentration is higher than the p-type impurity concentration is an n-type semiconductor region.

The quenching element 24 has a function of converting a change in the avalanche current generated in the photoelectric conversion element 22 into a voltage signal. Further, the quenching element 24 functions as a load circuit (quenching circuit) at the time of signal multiplication by avalanche multiplication, and has a function of reducing a voltage applied to the photoelectric conversion element 22 to suppress avalanche multiplication. The operation in which the quenching element 24 suppresses avalanche multiplication is called a quenching operation. Further, the quenching element 24 has a function of returning the voltage supplied to the photoelectric conversion element 22 to the voltage VH by passing a current corresponding to the voltage drop by the quenching operation. The operation in which the quenching element 24 returns the voltage supplied to the photoelectric conversion element 22 to the voltage VH is called a recharging operation. The quenching element 24 may be composed of a resistor, a MOS transistor, or the like.

The signal processing circuit 32 includes an input node to which an output signal of the photoelectric conversion unit 20 is supplied, and an output node. The signal processing circuit 32 has a function as a waveform shaping unit that converts an analog signal supplied from the photoelectric conversion unit 20 into a pulse signal. The signal processing circuit 32 may be configured by a logic circuit including a NOT circuit (inverter circuit), a NOR circuit, a NAND circuit, and the like. The output node of the signal processing circuit 32 is connected to the counter 34.

The counter 34 includes an input node to which an output signal of the signal processing circuit 32 is supplied, an input node connected to the control line 14, and an output node. The counter 34 has a function of counting pulses to be superimposed on a signal output from the signal processing circuit 32, and holding a count value as a counting result. The signal supplied from the vertical scanning circuit unit 40 to the counter 34 via the control line 14 may include an enable signal for controlling a pulse counting period (exposure period), a reset signal for resetting a count value held by the counter 34, and the like. The output node of the counter 34 is connected to the data line 16 via the pixel output circuit 36.

The pixel output circuit 36 has a function of switching an electrical connection state (connection or disconnection) between the counter 34 and the data line 16. The pixel output circuit 36 switches the connection state between the counter 34 and the data line 16 in accordance with a control signal supplied from the vertical scanning circuit unit 40 via the control line 14 (or a control signal supplied from the horizontal scanning circuit unit 60 via the control line 18 in the configuration example of FIG. 2). The pixel output circuit 36 may include a buffer circuit for outputting a signal.

The pixel 12 is typically a unit structure that outputs a pixel signal for forming an image. However, in the case where distance measurement or the like using a TOF (Time Of Flight) method is intended, the pixel 12 need not necessarily be a unit structure that outputs a pixel signal for forming an image. That is, the pixel 12 may be a unit structure that outputs a signal for measuring the time at which light has reached and the amount of light.

It is not necessary that the pixel signal processing unit 30 is provided for each pixel 12, and the pixel signal processing unit 30 may be provided for each of a plurality of pixels 12. In this case, one pixel signal processing unit 30 may be used to sequentially perform signal processing of the plurality of pixels 12.

The photoelectric conversion device 100 according to the present embodiment may be formed on one substrate, or may be configured as a stacked-type photoelectric conversion device in which a plurality of substrates is stacked. In the latter case, for example, as illustrated in FIG. 4, a sensor substrate 110 and a circuit substrate 180 may be stacked and electrically connected to each other to form a stacked-type photoelectric conversion device. At least the photoelectric conversion element 22 among the constituent elements of the pixel 12 may be disposed on the sensor substrate 110. Further, the quenching element 24 and the pixel signal processing unit 30 among the components of the pixel 12 may be disposed on the circuit substrate 180. The photoelectric conversion element 22, and the quenching element 24 and the pixel signal processing unit 30 are electrically connected to each other through an interconnection provided for each pixel 12. The circuit substrate 180 may further include a vertical scanning circuit unit 40, a readout circuit unit 50, a horizontal scanning circuit unit 60, an output circuit unit 70, a control pulse generation unit 80, and the like.

The photoelectric conversion element 22 of each pixel 12, and the quenching element 24 and the pixel signal processing unit 30 may be provided on the sensor substrate 110 and the circuit substrate 180 so as to overlap each other in a plan view. The vertical scanning circuit unit 40, the readout circuit unit 50, the horizontal scanning circuit unit 60, the output circuit unit 70, and the control pulse generation unit 80 may be arranged around the pixel region 10 formed by the plurality of pixels 12. Here, the "plan view" refers to a view from a direction perpendicular to the surface of the sensor substrate 110.

By configuring the stacked-type photoelectric conversion device 100, the degree of integration of elements may be increased and high functionality may be achieved. In particular, by disposing the photoelectric conversion element 22, and the quenching element 24 and the pixel signal processing unit 30 on different substrates, the photoelectric conversion element 22 may be disposed at high density without sacrificing the light receiving area of the photoelectric conversion element 22, and the photon detection efficiency may be improved.

The number of substrates constituting the photoelectric conversion device 100 is not limited to two, and three or more substrates may be stacked to form the photoelectric conversion device 100.

Although the sensor substrate 110 and the circuit substrate 180 are diced chips in FIG. 4, the sensor substrate 110 and the circuit substrate 180 are not limited to chips. For example, each of the sensor substrate 110 and the circuit substrate 180 may be a wafer. Further, the sensor substrate 110 and the circuit substrate 180 may be stacked in a wafer state and then diced, or may be stacked and bonded after each sensor substrate 110 and the circuit substrate 180 are formed into chips.

Next, a basic operation of the photoelectric conversion unit 20 in the photoelectric conversion device according to the present embodiment will be described with reference to FIG. 5A to FIG. 5C. FIG. 5A to FIG. 5C are diagrams illustrating the basic operation of the photoelectric conversion unit in the photoelectric conversion device according to the present embodiment. FIG. 5A is a circuit diagram of the photoelectric conversion unit 20 and the signal processing circuit 32, FIG. 5B illustrates a waveform of a signal at an input node (node A) of the signal processing circuit 32, and FIG. 5C illustrates a waveform of a signal at an output node (node B) of the signal processing circuit 32. Here, for simplicity of explanation, it is assumed that the signal processing circuit 32 is configured by an inverter circuit.

At time t0, a reverse bias voltage of a potential difference corresponding to (VH-VL) is applied to the photoelectric conversion element 22. Although a reverse bias voltage sufficient to cause avalanche multiplication is applied between the anode and the cathode of the APD constituting the photoelectric conversion element 22, there is no carrier that becomes a seed of avalanche multiplication in a state where no photon is incident on the photoelectric conversion element 22. Therefore, no avalanche multiplication occurs in the photoelectric conversion element 22, and no current flows through the photoelectric conversion element 22.

At the subsequent time t1, it is assumed that a photon enters the photoelectric conversion element 22. When the photon is incident on the photoelectric conversion element 22, an electron-hole pair is generated by photoelectric conversion, avalanche multiplication occurs using these carriers as a seed, and an avalanche multiplication current flows through the photoelectric conversion element 22. When the avalanche multiplication current flows through the quenching element 24, a voltage drop by the quenching element 24 occurs, and the voltage of the node A begins to drop. When the voltage drop amount of the node A increases and the avalanche multiplication stops at time t3, the voltage level of the node A does not drop any further.

When the avalanche multiplication in the photoelectric conversion element 22 stops, a current that compensates the voltage drop flows from the node to which the voltage VL is supplied to the node A via the photoelectric conversion element 22, and the voltage of the node A gradually increases. Then, at time t5, node A is settled to the original voltage level.

The signal processing circuit 32 binarizes the signal input from the node A according to a predetermined determination threshold value, and outputs the signal from the node B. Specifically, the signal processing circuit 32 outputs a low-level signal from the node B when the voltage level of the node A exceeds the determination threshold value, and outputs a high-level signal from the node B when the voltage level of the node A is equal to or lower than the determination threshold value. For example, as illustrated in FIG. 5B, it is assumed that the voltage of the node A is equal to or lower than the determination threshold value during a period from the time t2 to the time t4. In this case, as illustrated in FIG. 5C, the signal level at the node B becomes low-level during the period from the time t0 to the time t2, and during the period from the time t4 to the time t5, and becomes high-level during the period from the time t2 to the time t4.

Thus, the analog signal input from the node A is shaped into a digital signal by the signal processing circuit 32. A pulse signal output from the signal processing circuit 32 in response to incidence of the photon on the photoelectric conversion element 22 is a photon detection pulse signal.

Figure 6:
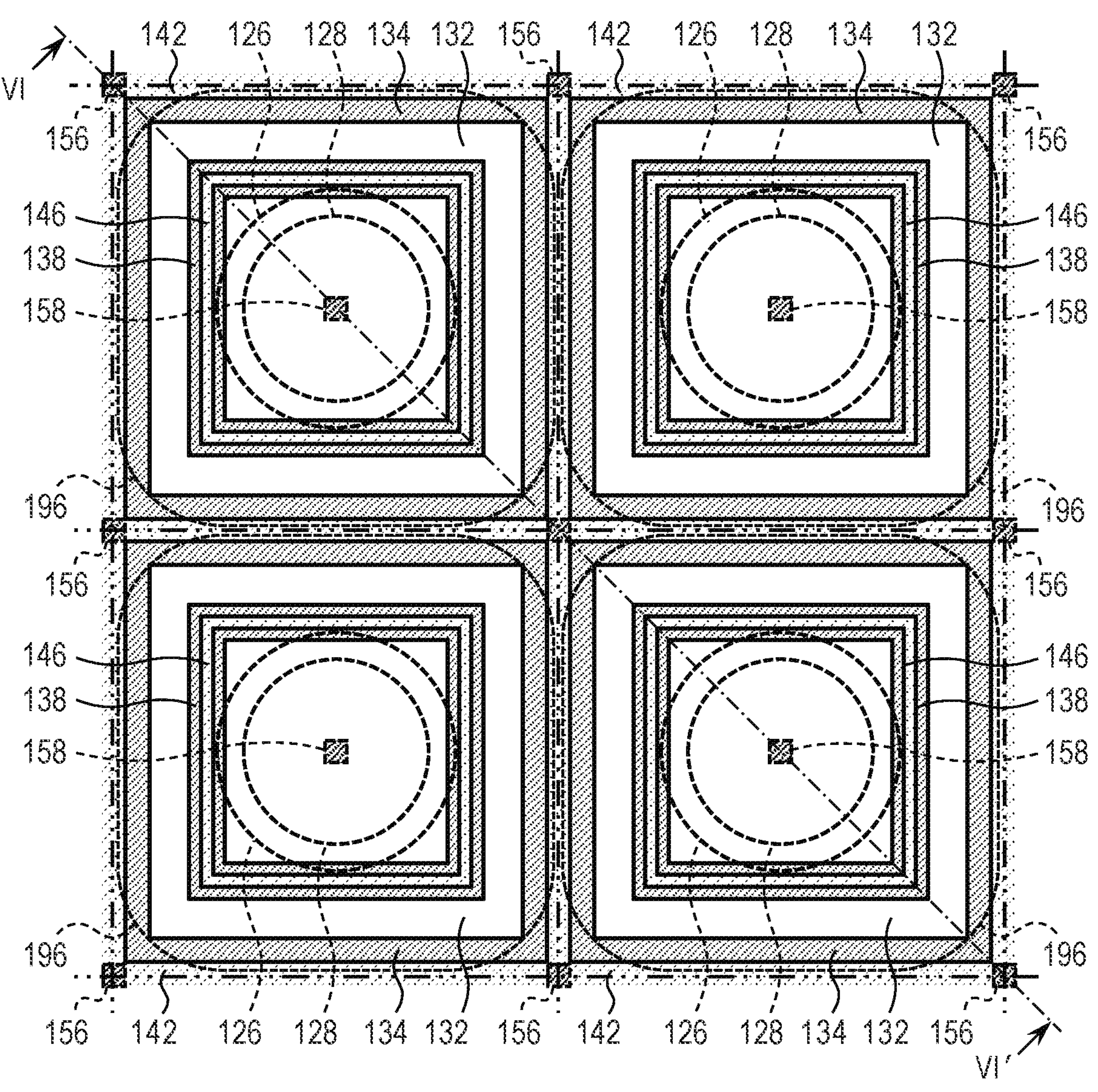
FIG. 6 is a plan view illustrating a structure of a photoelectric conversion element in the photoelectric conversion device according to the first embodiment of the present disclosure.
Figure 7:
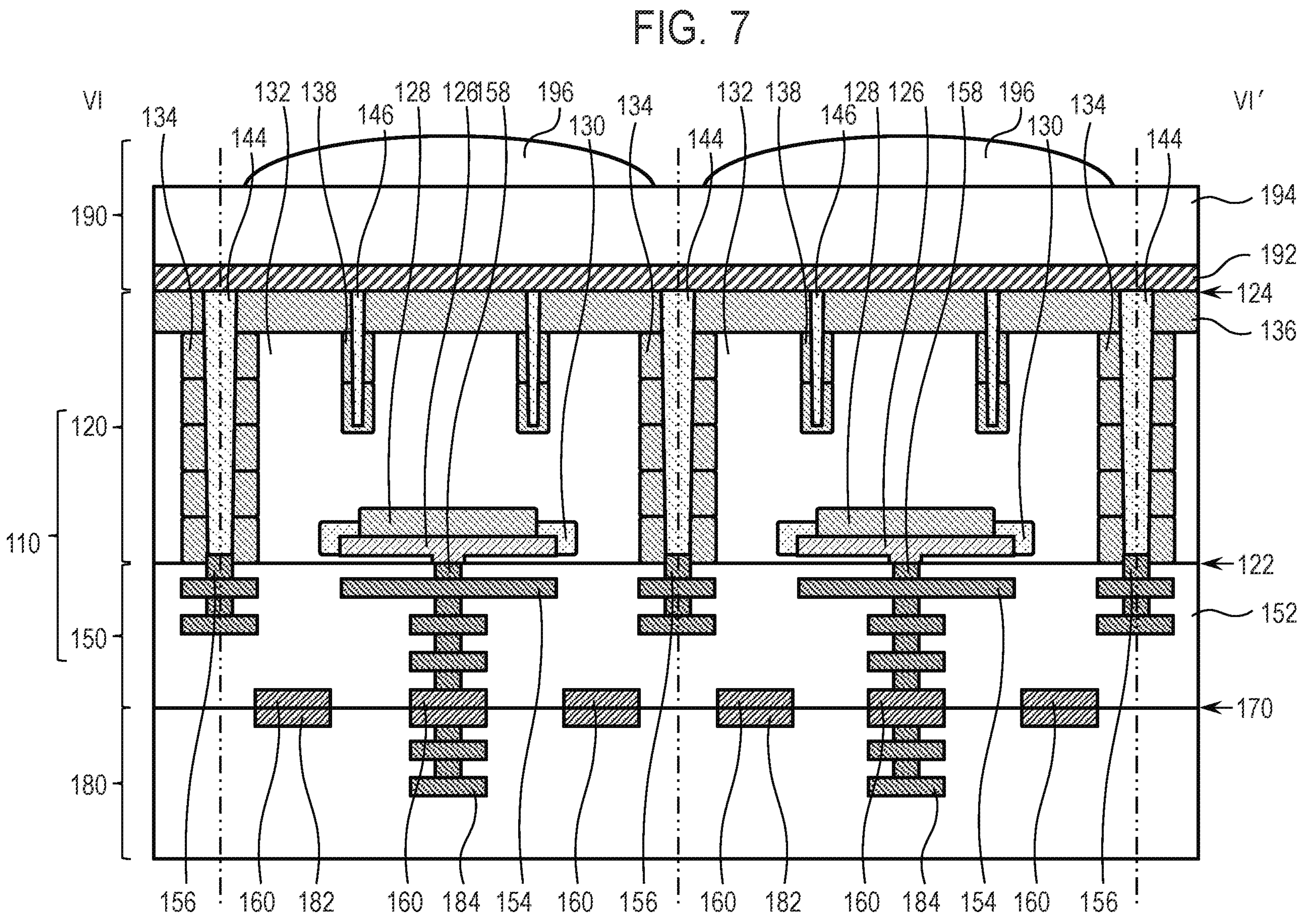
FIG. 7 is a schematic cross-sectional view illustrating a structure of the photoelectric conversion element in the photoelectric conversion device according to the first embodiment of the present disclosure.
Figure 8:
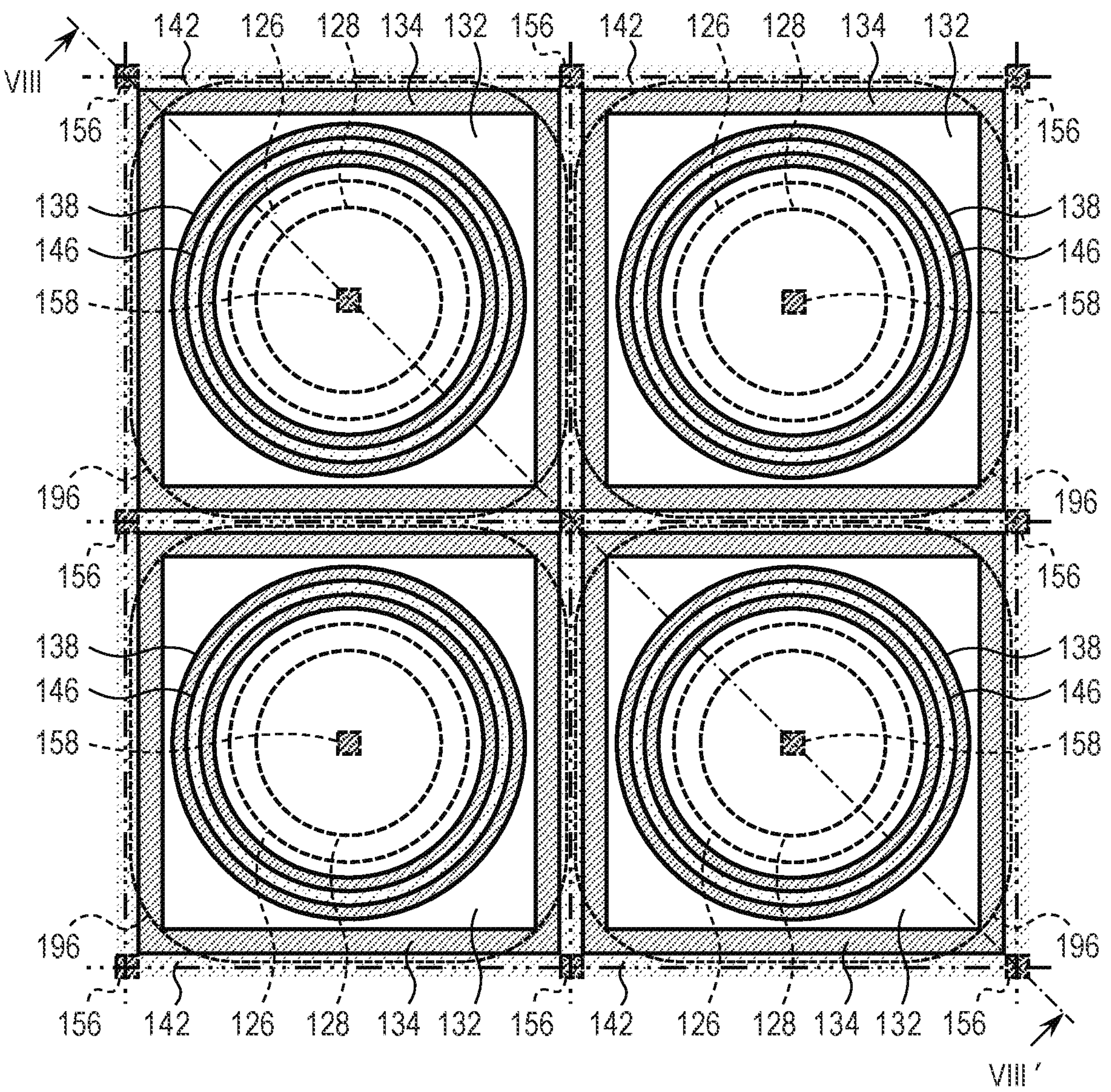
FIG. 8 is a plan view illustrating a structure of a photoelectric conversion element in a photoelectric conversion device according to a modified example of the first embodiment of the present disclosure.

Next, a specific structure of the photoelectric conversion element 22 in the photoelectric conversion device 100 according to the present embodiment will be described with reference to FIG. 6 to FIG. 8. FIG. 6 is a plan view illustrating a structure of the photoelectric conversion element in the photoelectric conversion device according to the present embodiment. FIG. 7 is a schematic cross-sectional view illustrating a structure of the photoelectric conversion element in the photoelectric conversion device according to the present embodiment. FIG. 8 is a plan view illustrating a structure of a photoelectric conversion element in a photoelectric conversion device according to a modified example of the present embodiment.

FIG. 6 illustrates the positional relationship of the components of the photoelectric conversion elements 22 in a plan view. FIG. 6 illustrates four photoelectric conversion elements 22 of four pixels 12 of 2 rows×2 columns arranged next to each other among the plurality of pixels 12 constituting the pixel region 10. FIG. 7 is a cross-sectional view taken along the line VI-VI' of FIG. 6. The direction along the line VI-VI' is a diagonal direction of the pixel 12. The two-dot chain lines illustrated in FIG. 6 and FIG. 7 indicate a boundary between adjacent pixels 12 (photoelectric conversion elements 22).

In this specification, the term "plan view" refers to a view taken from a normal direction of a light incident surface (second face 124) of the semiconductor layer 120 or a surface (first face 122) opposite to the light incident surface (second face 124) described later. In addition, a cross section refers to a cut surface parallel to a normal direction of the first face 122 or the second face 124 of the semiconductor layer 120. Note that the plan view illustrated in FIG. 6 and the like corresponds to a planar layout diagram obtained by vertically projecting each part on a projection plane parallel to the first face 122 or the second face 124, and does not necessarily illustrate a constituent part existing in the same plane. When the first face 122 or the second face 124 of the semiconductor layer 120 is a rough surface when viewed microscopically, a plan view is defined with reference to the first face 122 or the second face 124 of the semiconductor layer 120 when viewed macroscopically.

In this specification, the depth direction is a direction from the first face 122 to the second face 124 of the semiconductor layer 120. Hereinafter, the first face 122 may be referred to as a "front surface" and the second face 124 may be referred to as a "back surface".

As illustrated in, e.g., FIG. 7, the photoelectric conversion device according to the present embodiment may be configured as a stacked-type photoelectric conversion device in which the sensor substrate 110 and the circuit substrate 180 are stacked.

The sensor substrate 110 includes a semiconductor layer 120 having a first face 122 and a second face 124 opposed to the first face 122, and an interconnection structure layer 150 provided on the first face 122 side of the semiconductor layer 120. An optical structure layer 190 may be disposed on the second face 124 side of the semiconductor layer 120. The side of the second face 124 of the semiconductor layer 120 provided with the optical structure layer 190 serves as a light receiving surface for receiving light to be detected. That is, the photoelectric conversion device of the present embodiment is a so-called back-side illumination-type photoelectric conversion device.

The semiconductor layer 120 is formed by thinning a single crystalline silicon substrate, for example, and contains an n-type impurity or a p-type impurity at a predetermined concentration. In the present embodiment, as an example, the semiconductor layer 120 in which the p-type silicon substrate is thinned is assumed.

The semiconductor layer 120 is provided with n-type semiconductor regions 126 and 130, and p-type semiconductor regions 128, 132, 134, 136 and 138. The n-type semiconductor region 126 is disposed on the first face 122 side of the semiconductor layer 120 in a cross-sectional view, and at least a part of the n-type semiconductor region 126 reaches the first face 122 of the semiconductor layer 120. The p-type semiconductor region 128 is disposed closer to the second face 124 in the semiconductor layer 120 than the n-type semiconductor region 126, and forms a p-n junction with the n-type semiconductor region 126. The n-type semiconductor region 130 is disposed so as to be in contact with at least an end portion of the n-type semiconductor region 126 in a plan view. The p-type semiconductor region 136 is disposed on the second face 124 side of the semiconductor layer 120 in the cross-sectional view. The p-type semiconductor region 136 is provided over the entire region where the photoelectric conversion element 22 is disposed in the plan view. The p-type semiconductor region 134 is disposed so as to surround each of the regions in which the n-type semiconductor regions 126 and 130 and the p-type semiconductor region 128 are provided in the plan view. The p-type semiconductor region 134 is disposed from the first face 122 of the semiconductor layer 120 to a depth at which the p-type semiconductor region 136 is disposed. Each of regions in the semiconductor layer 120 surrounded by the p-type semiconductor regions 134 and 136 is a well region (p-type semiconductor region 132) in which the n-type semiconductor regions 126 and 130 and the p-type semiconductor region 128 of one photoelectric conversion element 22 are arranged. The impurity concentration of the p-type semiconductor region 132 is lower than the impurity concentration of the p-type semiconductor region 128. Thereby, a potential gradient is formed in the depth direction, and charges generated in the p-type semiconductor region 132 may be moved to an avalanche multiplication region.

In the plan view, the n-type semiconductor region 126 and the p-type semiconductor region 128 are disposed inside a region defined by the p-type semiconductor region 134. In addition, in the plan view, the p-type semiconductor region 128 is disposed in a region inside the n-type semiconductor region 126. The n-type semiconductor region 130 is disposed so as to surround the n-type semiconductor region 126 at a depth at which the n-type semiconductor region 126 is provided. The p-type semiconductor region 132 is disposed between the n-type semiconductor region 130 and the p-type semiconductor region 134 at a depth at which the n-type semiconductor regions 126 and 130 are provided.

In the present embodiment, one photoelectric conversion element 22 includes the n-type semiconductor regions 126 and 130 and the p-type semiconductor regions 128, 132, 134 and 136. The photoelectric conversion elements 22 arranged next to each other are electrically isolated from each other by the p-type semiconductor regions 134 and 136. In other words, the p-type semiconductor regions 134 and 136 form an isolation portion that electrically isolates the photoelectric conversion elements 22. A depletion layer formed in the p-n junction between the n-type semiconductor region 126 and the p-type semiconductor region 128 becomes the avalanche multiplication region. The n-type semiconductor region 130 has a role of suppressing edge breakdown at an end portion of the n-type semiconductor region 126, and has a lower impurity concentration than the n-type semiconductor region 126 under this purpose. By disposing the n-type semiconductor region 130 having a low impurity concentration at the end portion of the n-type semiconductor region 126, the electric field intensity at the end portion of the n-type semiconductor region 126 may be relaxed and the breakdown may be suppressed from occurring at a low voltage.

In a region between the pixel 12 (photoelectric conversion element 22) and the pixel 12 (photoelectric conversion element 22), a light guide structure 144 is provided so as to extend from the first face 122 to the second face 124 of the semiconductor layer 120. The light guide structure 144 may be provided in the p-type semiconductor region 134, as illustrated in FIG. 6 and FIG. 7. The light guide structure 144 has a role of preventing light from leaking into the adjacent photoelectric conversion elements 22, and is preferably a wall-shaped body surrounding each of the regions where the photoelectric conversion elements 22 are arranged. The light guide structure 144 may be formed, for example, by burying an insulating member or a metal member in a groove formed in the semiconductor layer 120. The depth of the light guide structure 144 may be appropriately set according to the required characteristics, and for example, the light guide structure 144 may be disposed from the second face 124 to the first face 122 of the semiconductor layer 120, or may be disposed from the second face 124 to a halfway depth of the semiconductor layer 120. The p-type semiconductor region 134 may have a role of suppressing dark current via interface states such as dangling bonds existing between the semiconductor layer 120 and the light guide structure 144 in addition to a role of separating the pixels.

The semiconductor layer 120 is further provided with a light guide structure 146. The light guide structure 146 is disposed so as to surround a region overlapping at least a part of the avalanche multiplication region, more preferably so as to surround a region overlapping the avalanche multiplication region in the plan view. The light guide structure 146 is disposed on the side of the second face 124 of the semiconductor layer 120 independent of the light guide structure 144. The light guide structure 146 is desirably provided over a depth of about 0.8 μm or more from the second face 124 of the semiconductor layer 120. The n-type semiconductor regions 126 and 130 and the p-type semiconductor region 128 are disposed closer to the first face 122 of the semiconductor layer 120 than the light guide structure 146.

A p-type semiconductor region 138 is provided around the light guide structure 146. The light guide structure 146 has a role of guiding light incident from the second face 124 side of the semiconductor layer 120 to the avalanche multiplication region. The light guide structure 146 may be formed, for example, by burying an insulating member or a metal member in a groove formed in the semiconductor layer 120. Similarly to the p-type semiconductor region 134, the p-type semiconductor region 138 has a role of suppressing a dark current via interface states such as dangling bonds existing between the semiconductor layer 120 and the light guide structure 146.

The shape of the light guide structure 146 in the plan view is not particularly limited as long as it surrounds a region overlapping at least a part of the avalanche multiplication region in the plan view. For example, the light guide structure 146 may have a polygonal shape as illustrated in FIG. 6 or a circular shape as illustrated in FIG. 8. FIG. 6 illustrates an example in which the shape of the light guide structure 146 in the plan view is a shape of a similar figure to the shape of the light guide structure 144 in the plan view. FIG. 8 illustrates an example in which the shape of the light guide structure 146 in a plan view is made circular so as to match the shape of the light condensed by the microlens 196, considering that the light incident on the semiconductor layer 120 is condensed into a circular shape or a shape close to a circular shape by the microlens 196. Alternatively, the shape of the light guide structure 146 in the plan view may be similar to the shape of the avalanche multiplication region in the plan view. Here, the circular shape is not limited to a true circle, and may be, for example, an oval shape.

In this specification, the light guide structures 144 and 146 may be regarded as one unit, and the light guide structure 144 may be referred to as a first portion of one light guide structure, and the light guide structure 146 may be referred to as a second portion of the one light guide structure. In this case, the first portion is disposed so as to surround a first region corresponding to a region where one photoelectric conversion element is provided in the plan view, and the second portion is disposed so as to surround a second region inside the first region in the plan view.

The interconnection structure layer 150 includes an insulating layer 152 and interconnection layers 154 disposed in the insulating layer 152. The interconnection layers 154 include an anode electrode 156 connected to the p-type semiconductor region 134, a cathode electrode 158 connected to the n-type semiconductor region 126, and a pad electrode 160 formed of an interconnection layer most distant from the semiconductor layer 120. For example, as illustrated in FIG. 6 and FIG. 7, the anode electrode 156 may be disposed at a position between the photoelectric conversion elements 22 arranged diagonally. Further, for example, as illustrated in FIG. 6 and FIG. 8, the cathode electrode 158 may be disposed at the center of the n-type semiconductor region 126 in the plan view. A plurality of cathode electrodes 158 may be disposed for one n-type semiconductor region 126.

The circuit substrate 180 is stacked on the side of the interconnection structure layer 150 of the sensor substrate 110. A bonding surface 170 in FIG. 7 is a bonding portion between the sensor substrate 110 and the circuit substrate 180. The circuit substrate 180 includes a semiconductor layer provided with an element such as a transistor and an interconnection structure layer provided on the semiconductor layer. FIG. 7 illustrates only the pad electrode 182 formed of the uppermost interconnection layer among the semiconductor layer and the interconnection structure layer constituting the circuit substrate 180 and a part of the interconnection layers 184 connected to the pad electrode 182 in order to simplify the drawing. The sensor substrate 110 and the circuit substrate 180 may be bonded to each other by, for example, metal bonding between a metal member constituting the pad electrode 160 and a metal member constituting the pad electrode 182.

The optical structure layer 190 may include a pinning film 192, a planarization layer 194, and a microlens layer including a plurality of microlenses 196. The optical structure layer 190 may further include a filter layer (not illustrated). Various optical filters such as a color filter, an infrared light cut filter, and a monochrome filter may be applied to the filter layer. Instead of providing the p-type semiconductor region 136 in the semiconductor layer 120, the pinning film 192 may be provided so as to be in contact with the p-type semiconductor region 134. A known material may be applied to the pinning film 192. The microlens 196 is preferably configured to condense incident light to a region of the semiconductor layer 120 inside the light guide structure 146.

A predetermined reverse bias voltage is applied between the p-type semiconductor region 128 and the n-type semiconductor region 126 via the anode electrode 156 and the cathode electrode 158. When photons are incident from the side of the second face 124 of the semiconductor layer 120 through the microlens 196, the incident photons excites electrons to generate electron-hole pairs (photoelectric conversion). When the charges (electrons) reach the avalanche multiplication region between the n-type semiconductor region 126 and the p-type semiconductor region 128, they are accelerated by the electric field between the n-type semiconductor region 126 and the p-type semiconductor region 128 to cause the avalanche multiplication. The carriers generated by the avalanche multiplication are collected via the cathode electrode 158 and output to the outside as an output signal of the photoelectric conversion element 22.

At this time, the light incident on the photoelectric conversion element 22 propagates while spreading in the semiconductor layer 120 after being condensed by the microlens 196. Although the photons absorbed in this process produce electron-hole pairs, the photons are not necessarily absorbed in the central portion of the photoelectric conversion element 22, but may be absorbed in the vicinity of the light guide structure 144. When compared with the charge generated in the central portion of the photoelectric conversion element 22, the probability that the charge generated in the vicinity of the light guide structure 144 is discharged to the cathode electrode 158 without passing through the avalanche multiplication region is high, which causes a decrease in the sensitivity of the photoelectric conversion element 22.

In this respect, in the photoelectric conversion element 22 of the present embodiment, the light guide structure 146 is disposed in a region inside the light guide structure 144 so as to surround at least a part of the avalanche multiplication region in the plan view. Accordingly, although the light condensed by the microlens 196 propagates while spreading in the semiconductor layer 120, the light propagates in a region inside the light guide structure 146 by being reflected by the light guide structure 146. Thereby, the proportion of the photons absorbed in the vicinity of the avalanche multiplication region out of the photons incident on the semiconductor layer 120 is increased, and consequently, the light receiving sensitivity of the photoelectric conversion element 22 may be improved. It is possible to further improve the sensitivity of the photoelectric conversion element 22 by designing the microlens 196 such that the focal position of the microlens 196 is located in the inner region of the light guide structure 146 so that more photons are absorbed in the inner region of the light guide structure 146.

When the optical image of the object is focused by an imaging lens and incident on the photoelectric conversion device 100, the incident angle of light from the imaging lens becomes larger as the photoelectric conversion element 22 is closer to the peripheral portion of the pixel region 10. As a result, as the photoelectric conversion element 22 is closer to the peripheral portion of the pixel region 10, the proportion of photons absorbed at a position away from the avalanche multiplication region is increased, and a phenomenon in which the peripheral portion becomes darker than the central portion of the pixel region 10, that is, so-called shading (peripheral light reduction) may occur. Even in such a case, by providing the light guide structure 146, light having a large incident angle may also be guided to the vicinity of the avalanche multiplication region, and shading may be suppressed.

Since the light condensed by the microlens 196 propagates while spreading in the semiconductor layer 120, the effect of the sensitivity improvement by the light guide structure 146 is more likely to be obtained for light of a longer wavelength that has a smaller absorption coefficient by the semiconductor layer 120 and penetrates deeper. Here, for example, when red light having a wavelength of 650 nm is taken as an example of light having a long wavelength, the light having a wavelength of 650 nm is absorbed by 20% to 30% while propagating through the semiconductor layer 120 by about 0.8 μm. In other words, by providing the light guide structure 146 over a depth of 0.8 μm or more from the second face 124, it is possible to suppress a decrease in sensitivity due to absorption in a region away from the avalanche multiplication region of at least 20% to 30% of light having a wavelength of 650 nm of incident light. The same applies not only to light having a wavelength of 650 nm but also to light absorbed during propagation at a distance of less than 0.8 μm.

As described above, according to the present embodiment, charges generated by photoelectric conversion may be efficiently guided to the avalanche multiplication region to improve the light receiving sensitivity.

Second Embodiment

Figure 9:
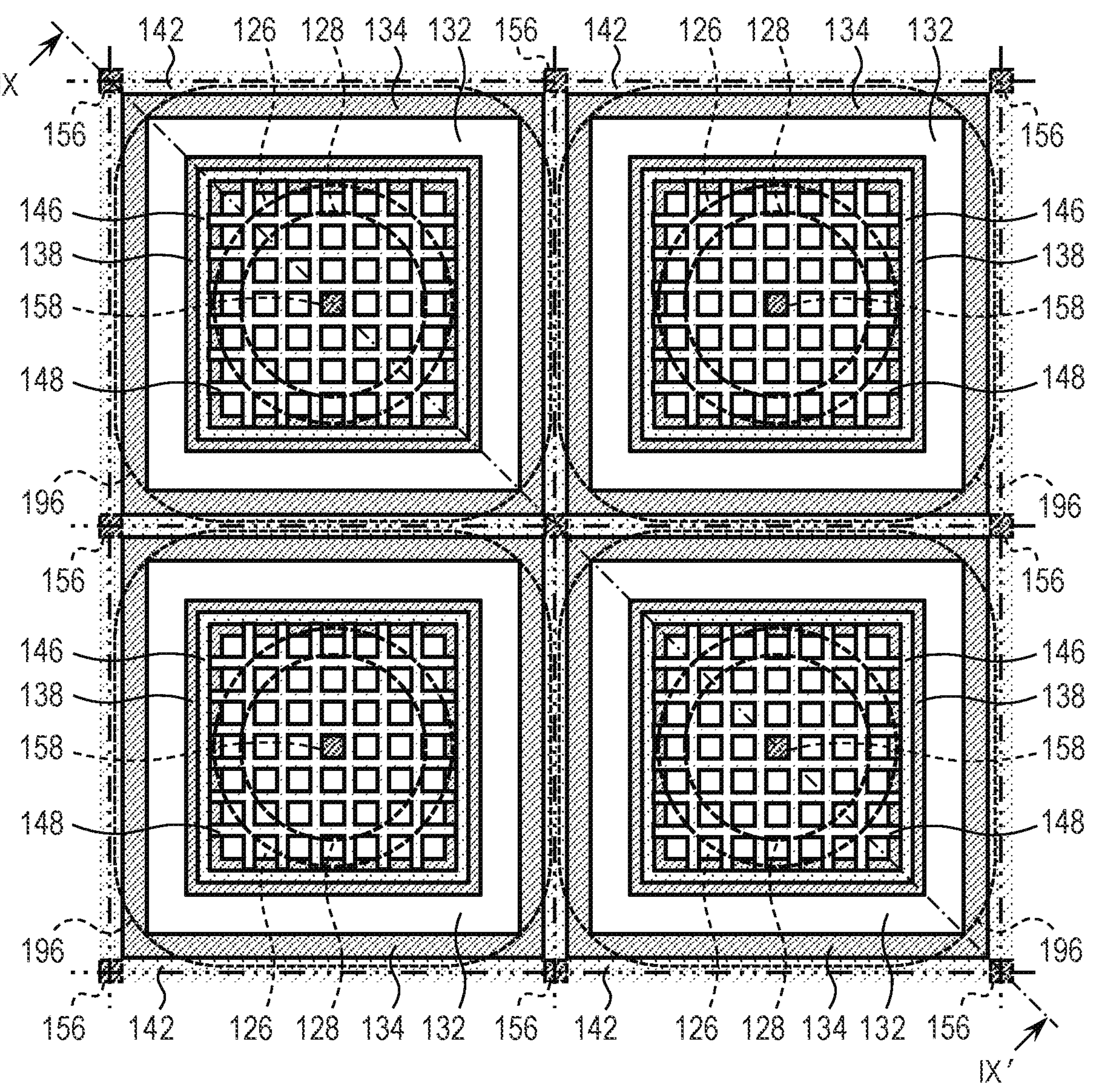
FIG. 9 is a plan view illustrating a structure of a photoelectric conversion element in a photoelectric conversion device according to a second embodiment of the present disclosure.
Figure 10:
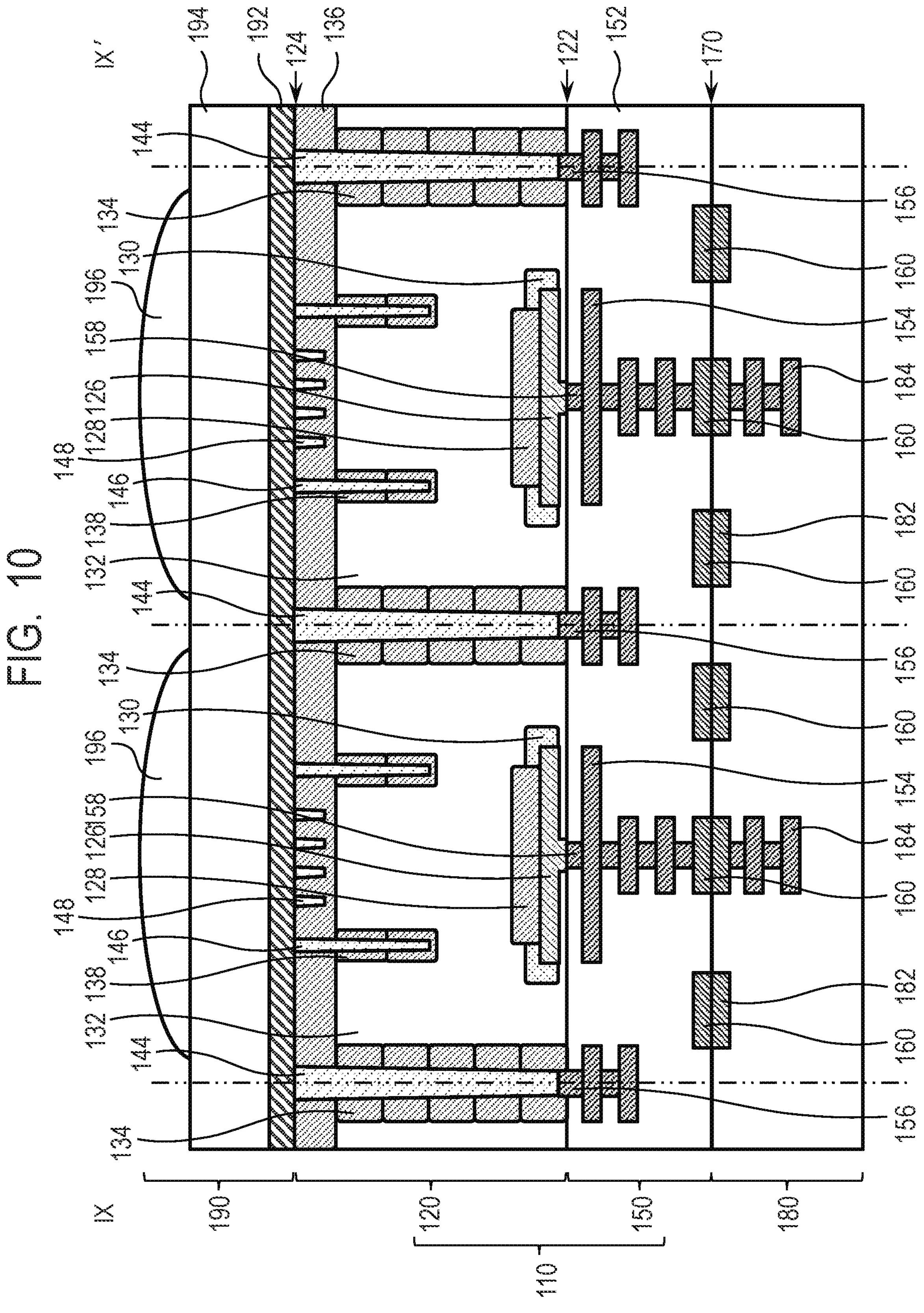
FIG. 10 is a schematic cross-sectional view illustrating a structure of the photoelectric conversion element in the photoelectric conversion device according to the second embodiment of the present disclosure.

A photoelectric conversion device according to a second embodiment of the present disclosure will be described with reference to FIG. 9 and FIG. 10. Components similar to those of the photoelectric conversion device according to the first embodiment are denoted by the same reference numerals, and descriptions thereof will be omitted or simplified. FIG. 9 is a plan view illustrating a structure of a photoelectric conversion element in the photoelectric conversion device according to the present embodiment. FIG. 10 is a schematic cross-sectional view illustrating a structure of the photoelectric conversion element in the photoelectric conversion device according to the present embodiment.

The photoelectric conversion device according to the present embodiment is the same as the photoelectric conversion device according to the first embodiment except that the configuration of the photoelectric conversion element 22 is different. In the present embodiment, portions of the photoelectric conversion element 22 of the present embodiment which are different from the photoelectric conversion element 22 of the first embodiment will be mainly described, and a description of portions common to the photoelectric conversion element 22 of the first embodiment will be appropriately omitted.

FIG. 9 illustrates the positional relationship of the components of the photoelectric conversion elements 22 in a plan view. FIG. 9 illustrates four photoelectric conversion elements 22 of four pixels 12 of 2 rows×2 columns arranged next to each other among the plurality of pixels 12 constituting the pixel region 10. FIG. 10 is a cross-sectional view taken along the line IX-IX' of FIG. 9.

As illustrated in FIG. 9 and FIG. 10, the photoelectric conversion element 22 of the present embodiment is different from the photoelectric conversion element 22 of the first embodiment in that the photoelectric conversion element 22 further includes a concave-convex structure 148 on the second face 124 side of the semiconductor layer 120.

The concave-convex structure 148 is provided at least in a region of the second face 124 of the semiconductor layer 120 which overlaps with a region surrounded by the light guide structure 146 in the plan view. The concave-convex structure 148 may be formed, for example, by burying an insulating member in a groove formed in the semiconductor layer 120 on the second face 124. The concave-convex structure 148 may be disposed in a region where at least a part of the concave-convex structure 148 overlaps with the p-type semiconductor region 136. It is desirable that the concave-convex structure 148 is disposed at a shallower portion than the p-type semiconductor region 136 of the semiconductor layer 120, that is, at a side of the second face 124 than the surface of the p-type semiconductor region 136 on the side of the first face 122. The depth of the concave-convex structure 148 is less than about 0.8 μm.

FIG. 9 and FIG. 10 illustrate an example in which a lattice-shaped groove is formed in the second face 124 of the semiconductor layer 120 as an example of the concave-convex structure 148. However, the concave-convex structure 148 has a role of scattering light incident from a side of the second face 124 of the semiconductor layer 120, and the pattern of the concave-convex structure 148 is not particularly limited as long as the concave-convex structure 148 has a function of scattering light incident from the side of the second face 124.

By providing the concave-convex structure 148 in the semiconductor layer 120, light incident on the semiconductor layer 120 is refracted or scattered by the concave-convex structure 148. This increases the distance of incident light traveling in the semiconductor layer 120 in conjunction with being reflected by the light guide structure 144, and more photons contribute to photoelectric conversion. On the other hand, since the incident light is refracted and scattered by the concave-convex structure 148, photons absorbed in a region away from the avalanche multiplication region in the plan view increase, and it becomes difficult to obtain an effect of improving sensitivity by the concave-convex structure 148.

In this respect, in the photoelectric conversion element 22 of the present embodiment, the light guide structure 146 is disposed in a region inside the light guide structure 144 so as to surround a region overlapping at least a part of the avalanche multiplication region in the plan view. Accordingly, the light condensed by the microlens 196 is refracted and scattered by the concave-convex structure 148 and travels while spreading in the semiconductor layer 120, but is reflected by the light guide structure 146 to propagate a region inside the light guide structure 146. Thereby, the proportion of the photons absorbed in the vicinity of the avalanche multiplication region out of the photons incident on the semiconductor layer 120 is increased, and consequently, the light receiving sensitivity of the photoelectric conversion element 22 may be improved.

Figure 11:
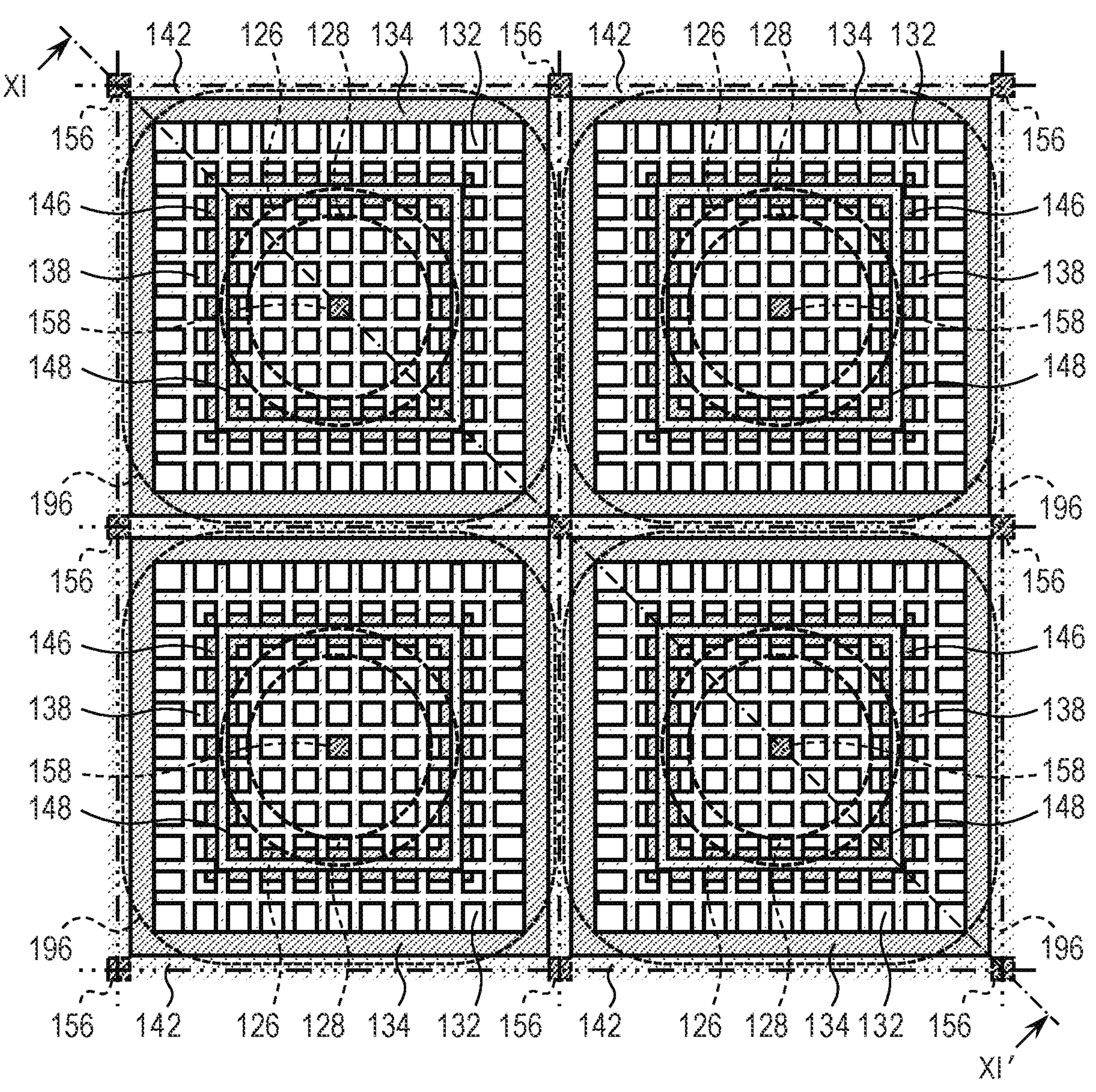
FIG. 11 is a plan view illustrating a structure of a photoelectric conversion element in a photoelectric conversion device according to a modified example of the second embodiment of the present disclosure.
Figure 12:
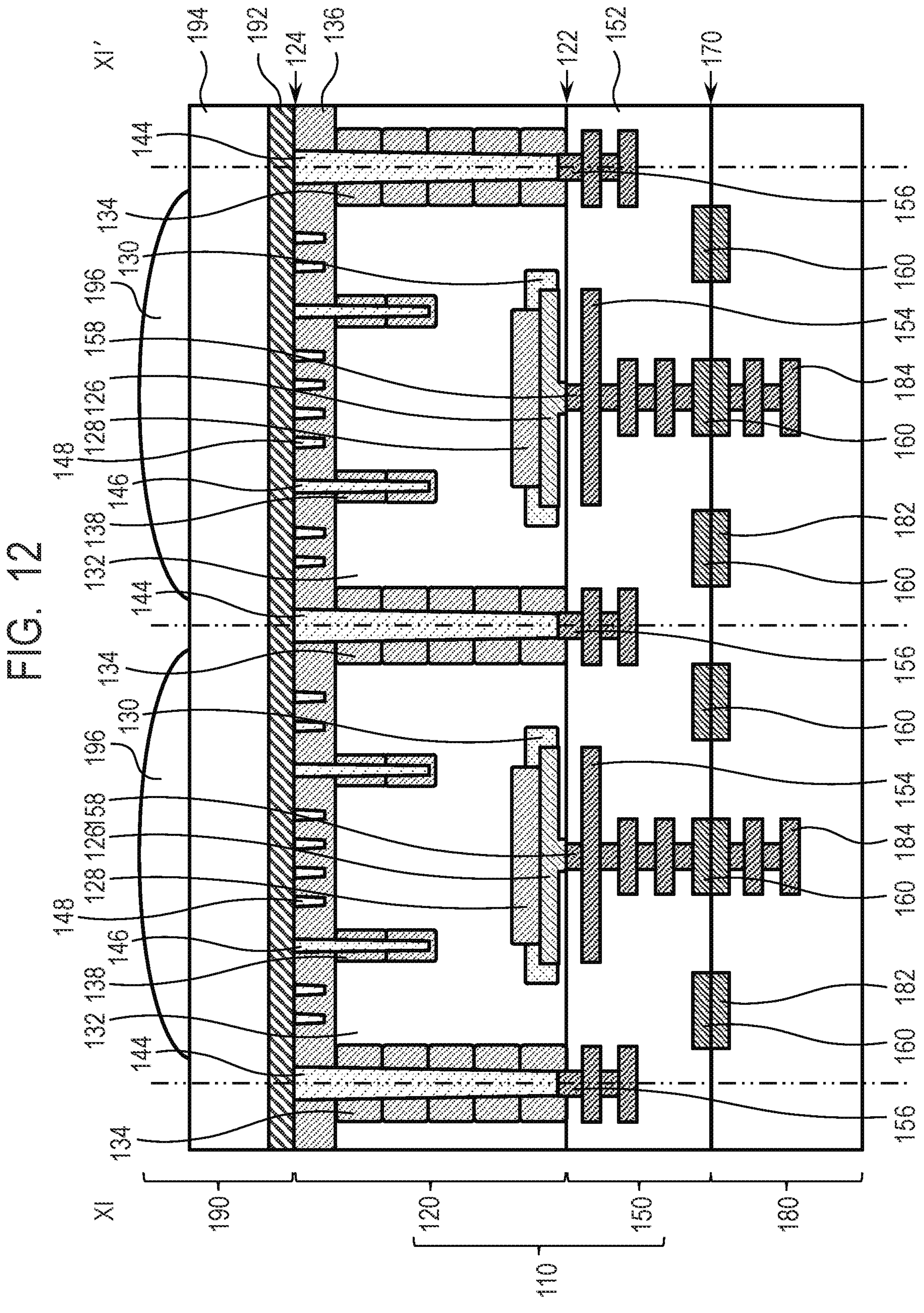
FIG. 12 is a schematic cross-sectional view illustrating a structure of the photoelectric conversion element in the photoelectric conversion device according to the modified example of the second embodiment of the present disclosure.

In the configuration examples of FIG. 9 and FIG. 10, the concave-convex structure 148 is disposed only in the region inside the light guide structure 146 in the plan view, but, for example, as illustrated in FIG. 11 and FIG. 12, the concave-convex structure 148 may also be disposed in the region outside the light guide structure 146 in the plan view.

FIG. 11 is a plan view illustrating a structure of a photoelectric conversion element in a photoelectric conversion device according to a modified example of the present embodiment. FIG. 12 is a schematic cross-sectional view illustrating a structure of the photoelectric conversion element in the photoelectric conversion device according to the modified example of the present embodiment. FIG. 11 illustrates the positional relationship of the components of the photoelectric conversion elements 22 in a plan view. FIG. 11 illustrates four photoelectric conversion elements 22 of four pixels 12 of 2 rows×2 columns arranged next to each other among the plurality of pixels 12 constituting the pixel region 10. FIG. 12 is a cross-sectional view taken along the line XI-XI' of FIG. 11. By configuring the photoelectric conversion element in this manner, as compared with the case where the concave-convex structure 148 is disposed only in the region inside the light guide structure 146 in the plan view, the stress generated by the concave-convex structure 148 becomes uniform, and the productivity may be improved.

As described above, according to the present embodiment, charges generated by photoelectric conversion may be efficiently guided to the avalanche multiplication region to improve the light receiving sensitivity.

Third Embodiment

Figure 13:
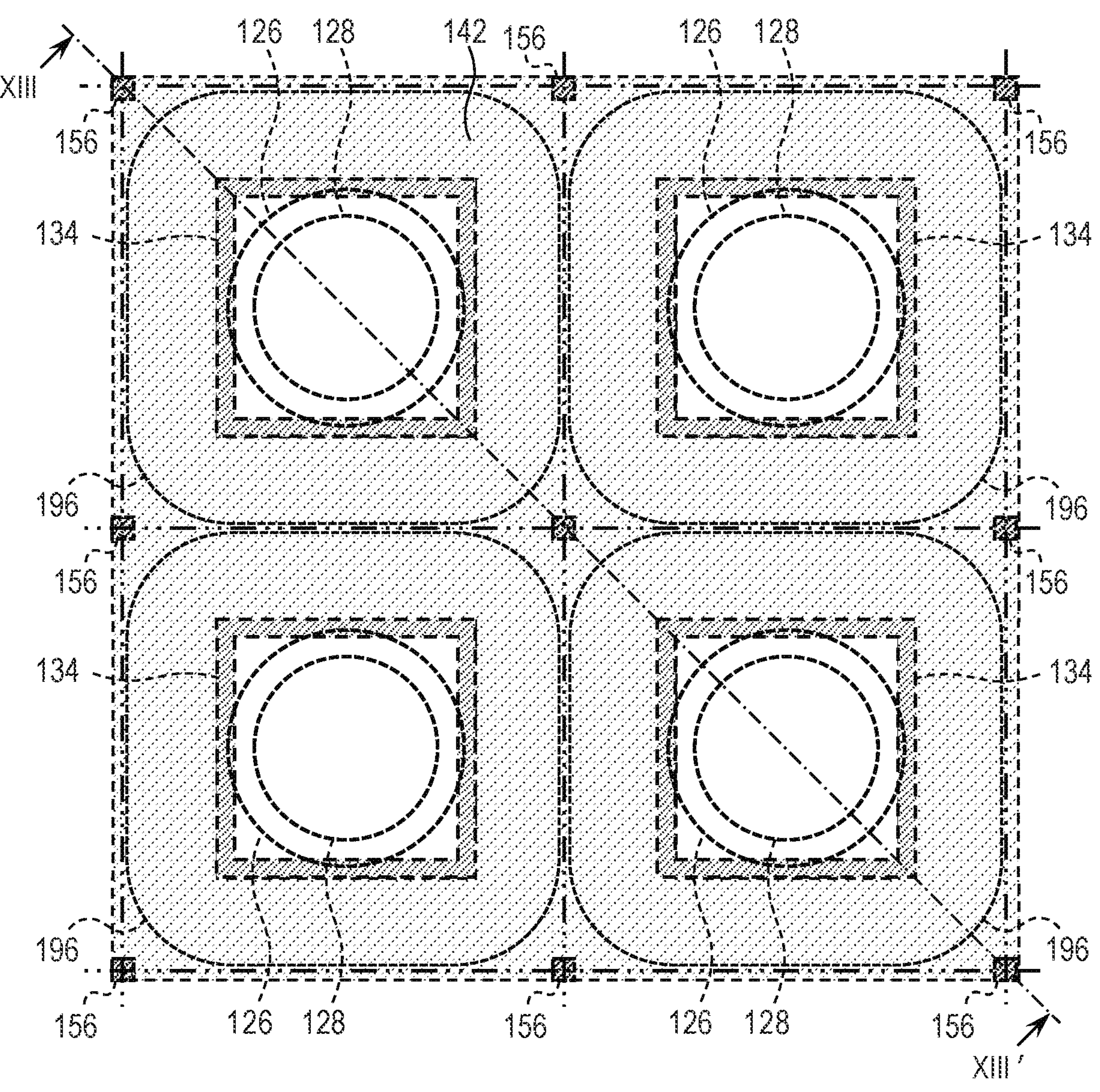
FIG. 13 is a plan view illustrating a structure of a photoelectric conversion element in a photoelectric conversion device according to a third embodiment of the present disclosure.
Figure 14:
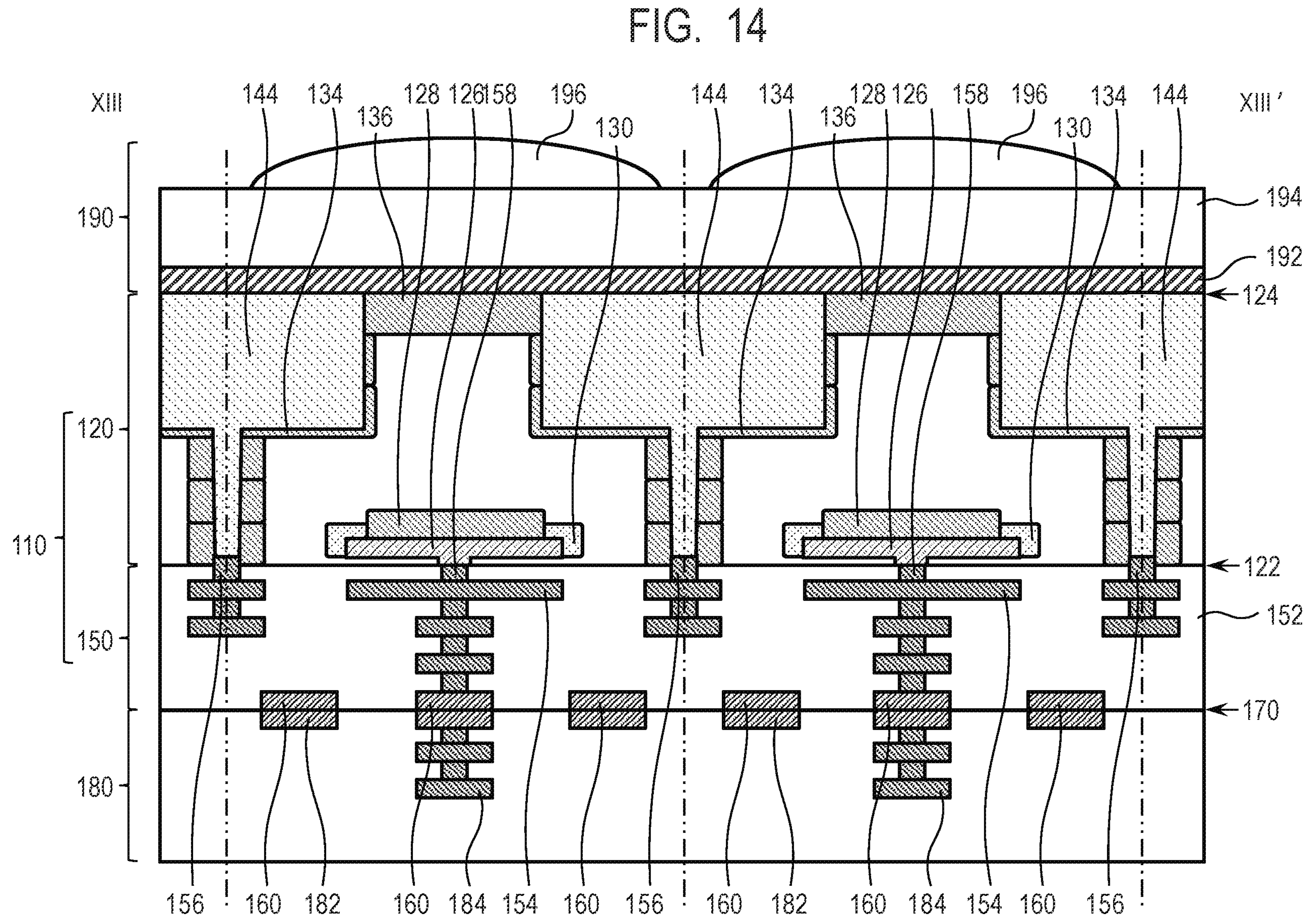
FIG. 14 is a schematic cross-sectional view illustrating a structure of the photoelectric conversion element in the photoelectric conversion device according to the third embodiment of the present disclosure.

A photoelectric conversion device according to a third embodiment of the present disclosure will be described with reference to FIG. 13 and FIG. 14. Components similar to those of the photoelectric conversion devices according to the first and second embodiments are denoted by the same reference numerals, and descriptions thereof will be omitted or simplified. FIG. 13 is a plan view illustrating a structure of a photoelectric conversion element in the photoelectric conversion device according to the present embodiment. FIG. 14 is a schematic cross-sectional view illustrating a structure of the photoelectric conversion element in the photoelectric conversion device according to the present embodiment.

The photoelectric conversion device according to the present embodiment is the same as the photoelectric conversion device according to the first embodiment except that the configuration of the photoelectric conversion element 22 is different. In the present embodiment, portions of the photoelectric conversion element 22 of the present embodiment which are different from the photoelectric conversion element 22 of the first embodiment will be mainly described, and a description of portions common to the photoelectric conversion element 22 of the first embodiment will be appropriately omitted.

FIG. 13 illustrates the positional relationship of the components of the photoelectric conversion element 22 in a plan view. FIG. 13 illustrates four photoelectric conversion elements 22 of four pixels 12 of 2 rows×2 columns arranged next to each other among the plurality of pixels 12 constituting the pixel region 10. FIG. 14 is a cross-sectional view taken along the line XIII-XIII' of FIG. 13.

The photoelectric conversion element 22 of the present embodiment is different from the photoelectric conversion element of the first embodiment in that the width of the light guide structure 144 in a plan view is different between a side of the first face 122 and a side of the second face 124 of the semiconductor layer 120, instead of providing the light guide structure 146. That is, in the light guide structure 144 of the photoelectric conversion element 22 according to the present embodiment, as illustrated in FIG. 13 and FIG. 14, the side of the second face 124 is wider than the side of the first face 122. The region of the semiconductor layer 120 defined by the light guide structure 144 on the side of the second face 124 corresponds to the region surrounded by the light guide structure 146 of the first embodiment. The depth of the portion where the width of the light guide structure 144 is increased corresponds to the depth at which the light guide structure 146 of the first embodiment is provided. Thus, the light guide structure 144 may have the same role as the light guide structure 146 of the first embodiment in addition to the role of preventing light from leaking into the adjacent photoelectric conversion elements 22.

By widening the width of the light guide structure 144 on the side of the second face 124, as in the case where the light guide structure 146 is provided, the proportion of the photons absorbed in the vicinity of the avalanche multiplication region out of the photons incident on the semiconductor layer 120 is increased, and consequently, the light receiving sensitivity of the photoelectric conversion element 22 may be improved. On the other hand, when the distance between the p-type semiconductor region 128 and the light guide structure 144 is short, a strong electric field is likely to be generated, and there is a possibility that noise due to tunnel current increases. Therefore, it is not preferable to increase the width of the light guide structure 144 on the side of the first face 122. By making the width of the light guide structure 144 narrower on the side of the first face 122 and wider on the side of the second face 124, both the improvement of sensitivity and the reduction of noise may be achieved.

The light guide structure 144 having different widths on the side of the first face 122 and the side of the second face 124 is not particularly limited, but may be formed by, for example, the following method. The first method is a method in which a light guide structure having a narrow width is formed from the first face 122 side, a light guide structure having a wide width is formed from the second face 124 side, and the light guide structure 144 is formed by these structures. The second method is a method in which a wide isolation groove is formed from the side of the second face 124 to the intermediate depth of the semiconductor layer 120, a narrow isolation groove is formed to the depth penetrating the semiconductor layer 120, and an insulator or a metal is buried in the communicating isolation grooves to form the light guide structure 144. When the light guide structure 144 is formed by these methods, the width of the light guide structure 144 in cross-sectional view varies discontinuously along the depth direction of the semiconductor layer 120.

As described above, according to the present embodiment, charges generated by photoelectric conversion may be efficiently guided to the avalanche multiplication region to improve the light receiving sensitivity.

Fourth Embodiment

Figure 15:
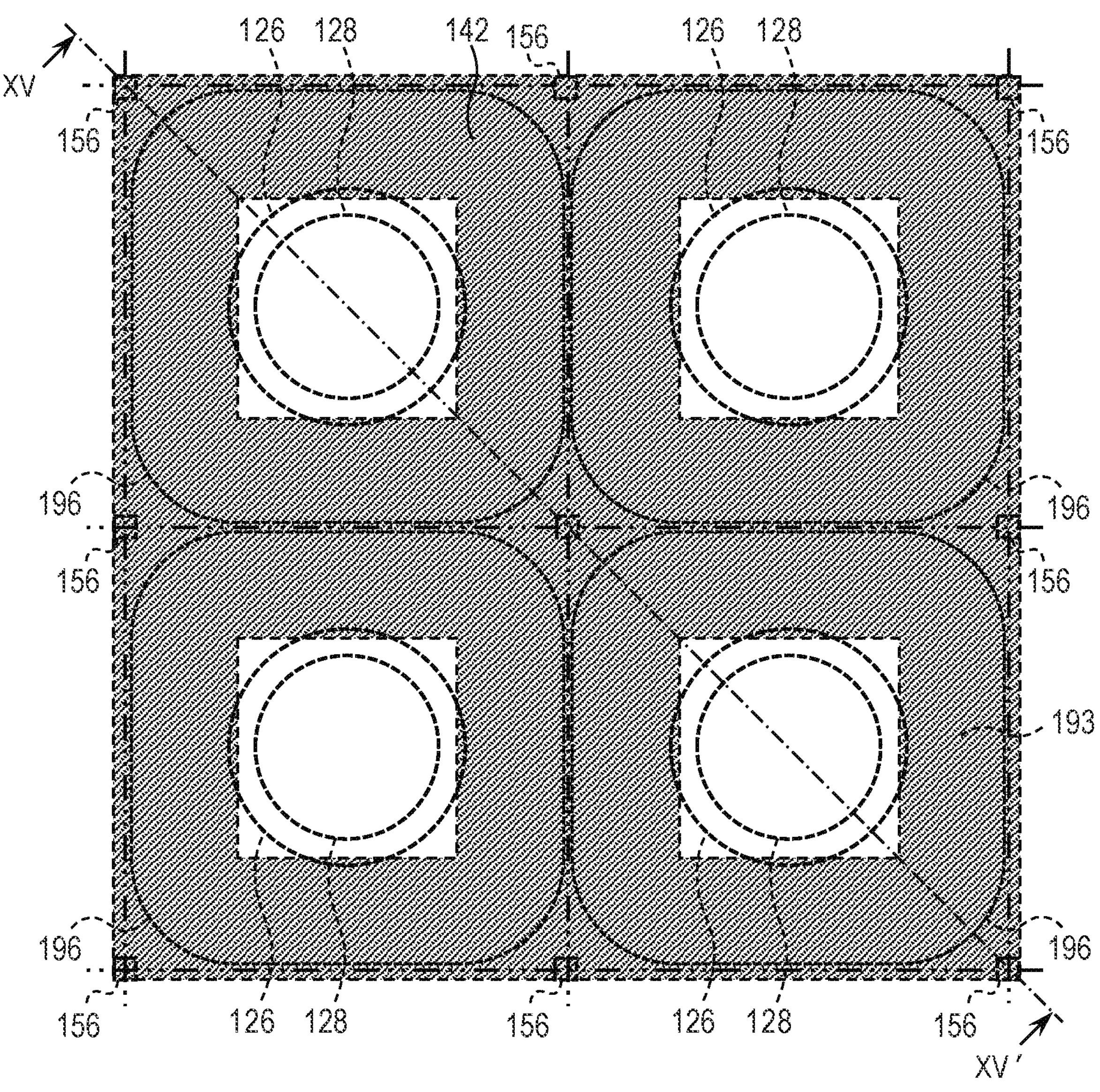
FIG. 15 is a plan view illustrating a structure of a photoelectric conversion element in a photoelectric conversion device according to a fourth embodiment of the present disclosure.
Figure 16:
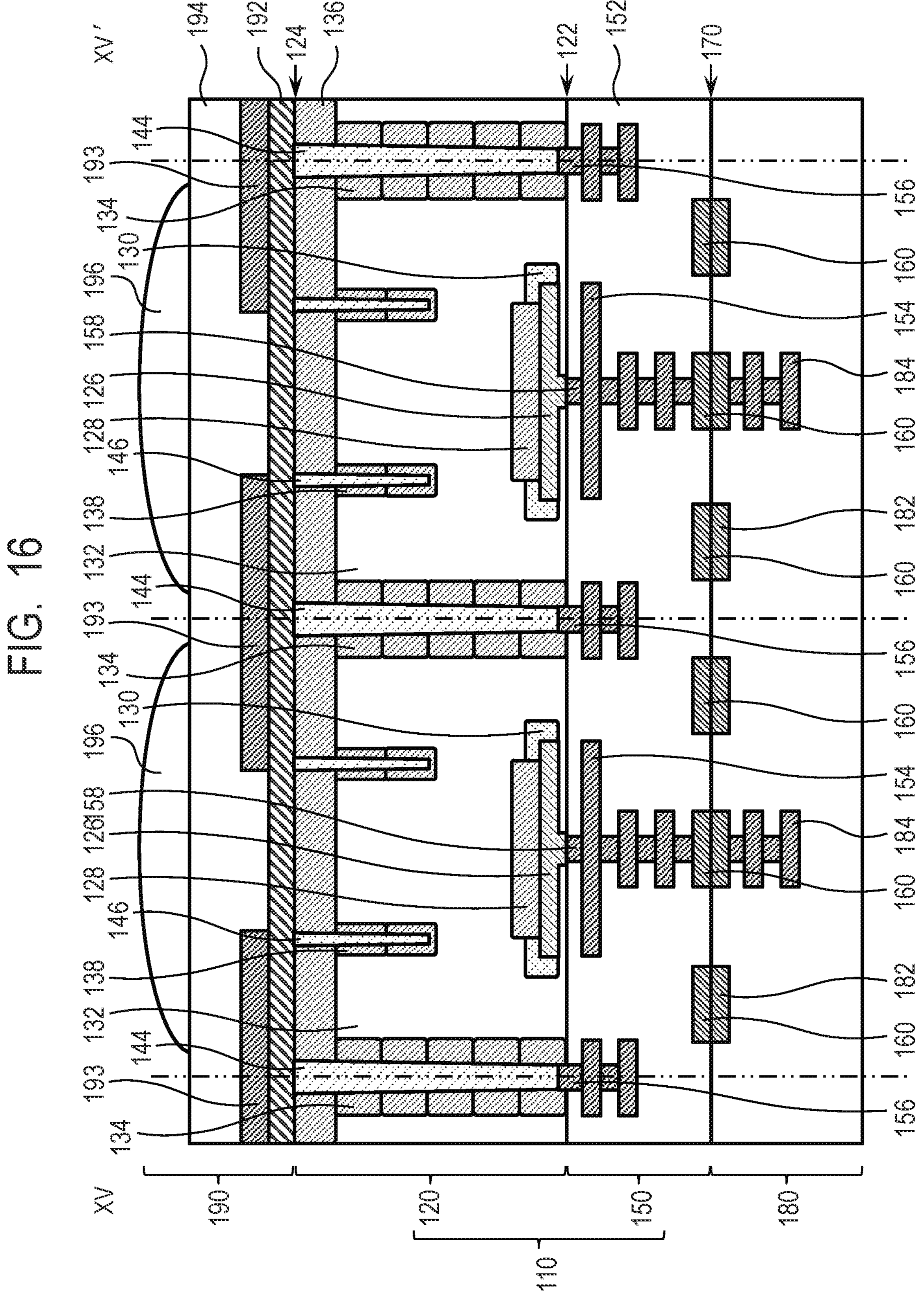
FIG. 16 is a schematic cross-sectional view illustrating a structure of the photoelectric conversion element in the photoelectric conversion device according to the fourth embodiment of the present disclosure.

A photoelectric conversion device according to a fourth embodiment of the present disclosure will be described with reference to FIG. 15 and FIG. 16. Components similar to those of the photoelectric conversion devices according to the first to third embodiments are denoted by the same reference numerals, and descriptions thereof will be omitted or simplified. FIG. 15 is a plan view illustrating a structure of a photoelectric conversion element in the photoelectric conversion device according to the present embodiment. FIG. 16 is a schematic cross-sectional view illustrating a structure of the photoelectric conversion element in the photoelectric conversion device according to the present embodiment.

The photoelectric conversion device according to the present embodiment is the same as the photoelectric conversion device according to the first embodiment except that the configuration of the photoelectric conversion element 22 is different. In the present embodiment, portions of the photoelectric conversion element 22 of the present embodiment which are different from the photoelectric conversion element 22 of the first embodiment will be mainly described, and a description of portions common to the photoelectric conversion element 22 of the first embodiment will be appropriately omitted.

FIG. 15 illustrates the positional relationship of the components of the photoelectric conversion element 22 in a plan view. FIG. 15 illustrates four photoelectric conversion elements 22 of four pixels 12 of 2 rows×2 columns arranged next to each other among the plurality of pixels 12 constituting the pixel region 10. FIG. 16 is a cross-sectional view taken along line XV-XV' of FIG. 15.

The photoelectric conversion element 22 of the present embodiment is different from the photoelectric conversion element of the first embodiment in that it further includes a light shielding layer 193 provided in the optical structure layer 190. For example, as illustrated in FIG. 16, the light shielding layer 193 may be disposed between the pinning film 192 and the planarization layer 194. Further, for example, as illustrated in FIG. 15, the light shielding layer 193 is disposed so as to cover a portion of the region surrounded by the light guide structure 144 except the region surrounded by the light guide structure 146 in a plan view. By providing the light shielding layer 193, light may be prevented from entering a region outside the light guide structure 146.

Although the charge generated by the photoelectric conversion moves toward the avalanche multiplication region, the time required for the charge to reach the avalanche multiplication region varies depending on the place where the charge is generated. For example, the charge generated outside the region surrounded by the light guide structure 146 in the plan view requires longer time to reach the avalanche multiplication region than the charge generated inside the region surrounded by the light guide structure 146 in the plan view. Therefore, for example, when the photoelectric conversion device is used as the light receiving portion of the distance measuring device, a width is generated in the light detection timing, and the distance measuring accuracy is reduced.

In this respect, in the photoelectric conversion element 22 of the present embodiment, the light incident on the region outside the light guide structure 146 is blocked by the light shielding layer 193, and photoelectric conversion is generated in the region inside the light guide structure 146. This makes it possible to reduce variation in time required for the charge generated in the semiconductor layer 120 to reach the avalanche multiplication region. Therefore, in the case where the photoelectric conversion device is used as the light receiving portion of the distance measuring device, it is possible to suppress a decrease in the distance measuring accuracy.

As described above, according to the present embodiment, charges generated by photoelectric conversion may be efficiently guided to the avalanche multiplication region to improve the light receiving sensitivity.

Fifth Embodiment

Figure 17:
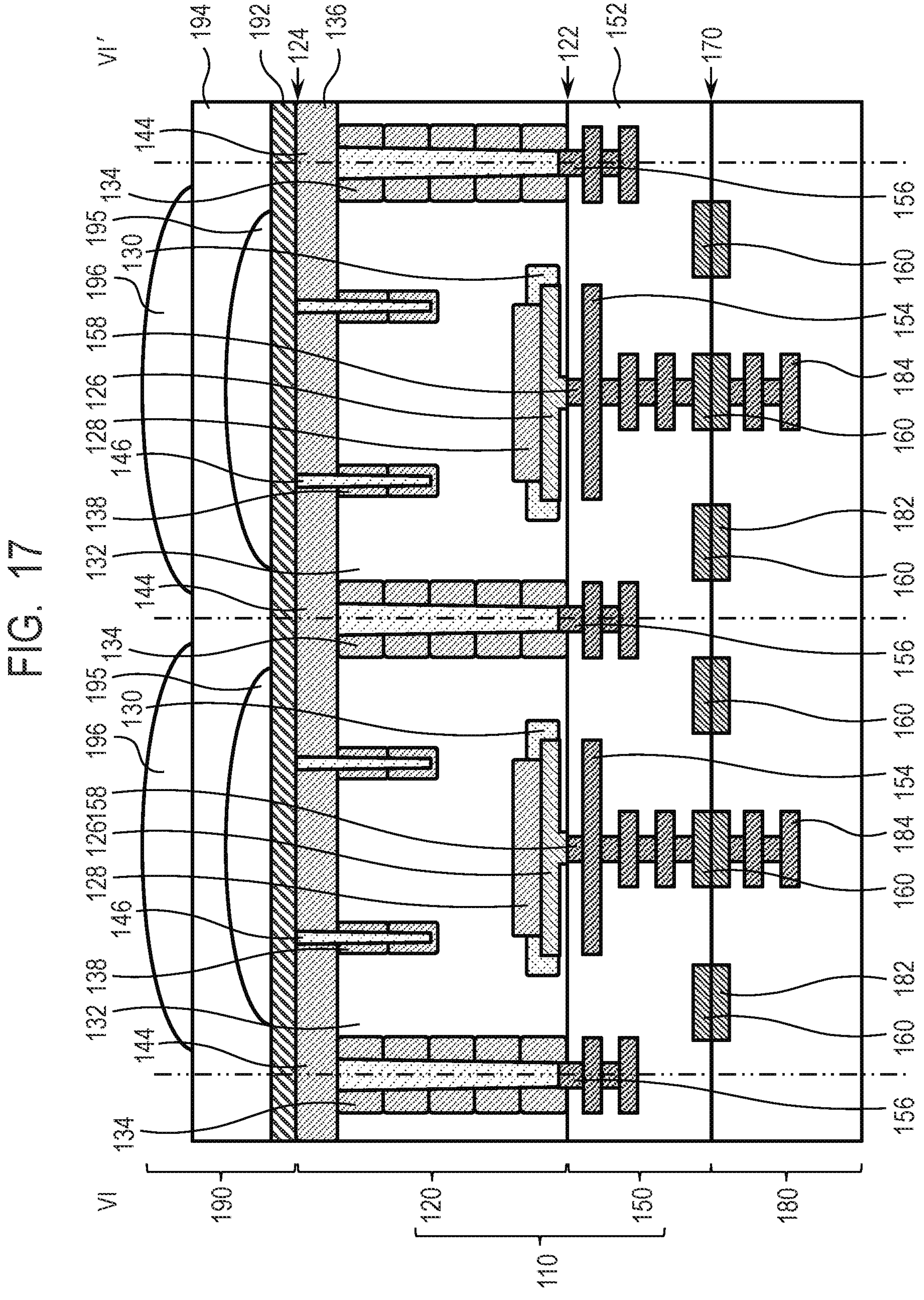
FIG. 17 is a schematic cross-sectional view illustrating a structure of a photoelectric conversion element in a photoelectric conversion device according to a fifth embodiment of the present disclosure.

A photoelectric conversion device according to a fifth embodiment of the present disclosure will be described with reference to FIG. 17. Components similar to those of the photoelectric conversion devices according to the first to fourth embodiments are denoted by the same reference numerals, and descriptions thereof will be omitted or simplified. FIG. 17 is a cross-sectional view illustrating a structure of a photoelectric conversion element in the photoelectric conversion device according to the present embodiment. The planar layout of the photoelectric conversion element of the present embodiment is basically the same as the planar layout of the photoelectric conversion element of the first embodiment illustrated in FIG. 6. FIG. 17 corresponds to a cross-sectional view taken along the line VI-VI' of FIG. 6.

The photoelectric conversion device according to the present embodiment is the same as the photoelectric conversion device according to the first embodiment except that the configuration of the photoelectric conversion element 22 is different. In the present embodiment, portions of the photoelectric conversion element 22 of the present embodiment which are different from the photoelectric conversion element 22 of the first embodiment will be mainly described, and a description of portions common to the photoelectric conversion element 22 of the first embodiment will be appropriately omitted.

The photoelectric conversion element 22 of the present embodiment is different from the photoelectric conversion element of the first embodiment in that it further includes an inner-layer lens 195 disposed between the semiconductor layer 120 and the microlens 196. The inner-layer lens 195 may be disposed between the pinning film 192 and the planarization layer 194 of the optical structure layer 190, for example, as illustrated in FIG. 17. The inner-layer lens 195 has a shape for condensing incident light, for example, a convex lens shape.

By providing the inner-layer lens 195 between the semiconductor layer 120 and the microlens 196, the incident light may be easily guided to the region inside the light guide structure 146, and the light receiving sensitivity may be improved. Further, since the incident light component that is photoelectrically converted outside the light guide structure 146 is reduced, in the case where the photoelectric conversion device is used as the light receiving portion of the distance measuring device, it is possible to suppress a decrease in the distance measuring accuracy.

As described above, according to the present embodiment, charges generated by photoelectric conversion may be efficiently guided to the avalanche multiplication region to improve the light receiving sensitivity.

Sixth Embodiment

Figure 18:
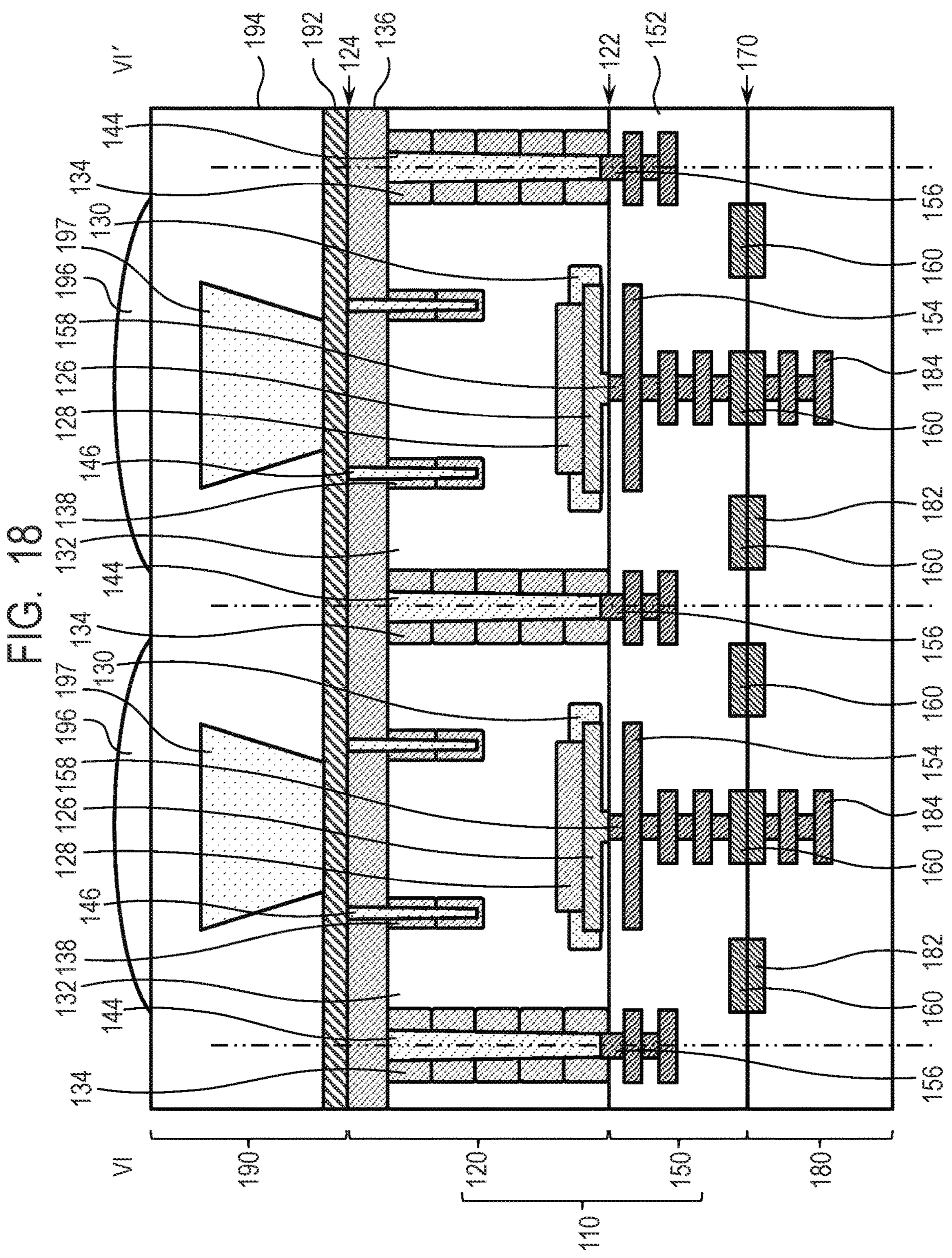
FIG. 18 is a schematic cross-sectional view illustrating a structure of a photoelectric conversion element in a photoelectric conversion device according to a sixth embodiment of the present disclosure.

A photoelectric conversion device according to a sixth embodiment of the present disclosure will be described with reference to FIG. 18. Components similar to those of the photoelectric conversion devices according to the first to fifth embodiments are denoted by the same reference numerals, and descriptions thereof will be omitted or simplified. FIG. 18 is a cross-sectional view illustrating a structure of a photoelectric conversion element in the photoelectric conversion device according to the present embodiment. The planar layout of the photoelectric conversion element of the present embodiment is basically the same as the planar layout of the photoelectric conversion element of the first embodiment illustrated in FIG. 6. FIG. 18 corresponds to a cross-sectional view taken along the line VI-VI' of FIG. 6.

The photoelectric conversion device according to the present embodiment is the same as the photoelectric conversion device according to the first embodiment except that the configuration of the photoelectric conversion element 22 is different. In the present embodiment, portions of the photoelectric conversion element 22 of the present embodiment which are different from the photoelectric conversion element 22 of the first embodiment will be mainly described, and a description of portions common to the photoelectric conversion element 22 of the first embodiment will be appropriately omitted.

The photoelectric conversion element 22 of the present embodiment is different from the photoelectric conversion element of the first embodiment in that it further includes an optical waveguide 197 disposed between the semiconductor layer 120 and the microlens 196. The optical waveguide 197 may be disposed between the pinning film 192 and the planarization layer 194 of the optical structure layer 190, for example, as illustrated in FIG. 18. The optical waveguide 197 is made of a material having a higher refractive index than the material forming the planarization layer 194, and has an effect of confining and propagating incident light in the optical waveguide 197.

By providing the optical waveguide 197 between the semiconductor layer 120 and the microlens 196, the incident light may be easily guided to the region inside the light guide structure 146, and the light receiving sensitivity may be improved. Further, since the incident light component that is photoelectrically converted outside the light guide structure 146 is reduced, deterioration of the distance measurement accuracy may be suppressed when the photoelectric conversion device is used as the light receiving portion of the distance measuring device.

As described above, according to the present embodiment, charges generated by photoelectric conversion may be efficiently guided to the avalanche multiplication region to improve the light receiving sensitivity.

Seventh Embodiment

Figure 19:
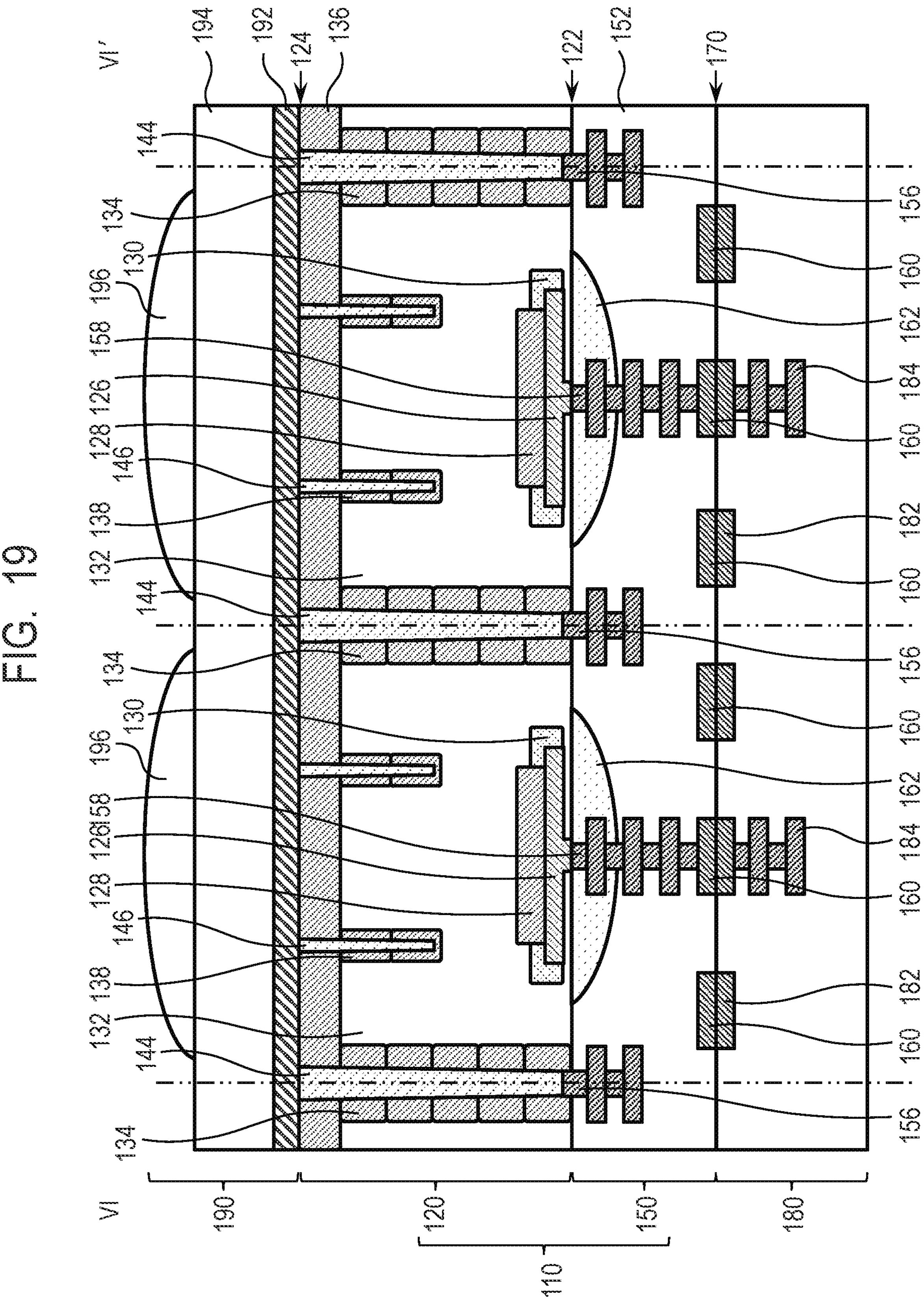
FIG. 19 is a schematic cross-sectional view illustrating a structure of a photoelectric conversion element in a photoelectric conversion device according to a seventh embodiment of the present disclosure.

A photoelectric conversion device according to a seventh embodiment of the present disclosure will be described with reference to FIG. 19. Components similar to those of the photoelectric conversion devices according to the first to sixth embodiments are denoted by the same reference numerals, and descriptions thereof will be omitted or simplified. FIG. 19 is a cross-sectional view illustrating a structure of a photoelectric conversion element in the photoelectric conversion device according to the present embodiment. The planar layout of the photoelectric conversion element of the present embodiment is basically the same as the planar layout of the photoelectric conversion element of the first embodiment illustrated in FIG. 6. FIG. 19 corresponds to a cross-sectional view taken along the line VI-VI' of FIG. 6.

The photoelectric conversion device according to the present embodiment is the same as the photoelectric conversion device according to the first embodiment except that the configuration of the photoelectric conversion element 22 is different. In the present embodiment, portions of the photoelectric conversion element 22 of the present embodiment which are different from the photoelectric conversion element 22 of the first embodiment will be mainly described, and a description of portions common to the photoelectric conversion element 22 of the first embodiment will be appropriately omitted.

The photoelectric conversion element 22 of the present embodiment is different from the photoelectric conversion element of the first embodiment in that it further includes a curved reflection layer 162 provided in the insulating layer 152. As illustrated in FIG. 19, the curved reflection layer 162 is disposed on a side of the first face 122 of the semiconductor layer 120 in a region overlapping the n-type semiconductor region 126 in a plan view, and has a sphere-shaped outer shape convex on the side of the insulating layer 152. The optical waveguide 197 is formed of a material having a refractive index different from that of a material forming the insulating layer 152, and has a role of reflecting incident light transmitted through the semiconductor layer 120 at an interface with the insulating layer 152.

By providing the curved reflection layer 162 facing the first face 122 of the semiconductor layer 120, the incident light transmitted through the semiconductor layer 120 may be reflected toward the center of the photoelectric conversion element 22. Thereby, the light reflected by the curved reflection layer 162 is easily photoelectrically converted in a region overlapping with the avalanche multiplication region in a plan view, and the light reception sensitivity may be improved. In the present embodiment, as the cathode electrode 158 is formed smaller, a component reflected by the curved reflection layer 162 in the center direction of the photoelectric conversion element 22 may be increased.

As described above, according to the present embodiment, charges generated by photoelectric conversion may be efficiently guided to the avalanche multiplication region to improve the light receiving sensitivity.

Eighth Embodiment

Figure 20:
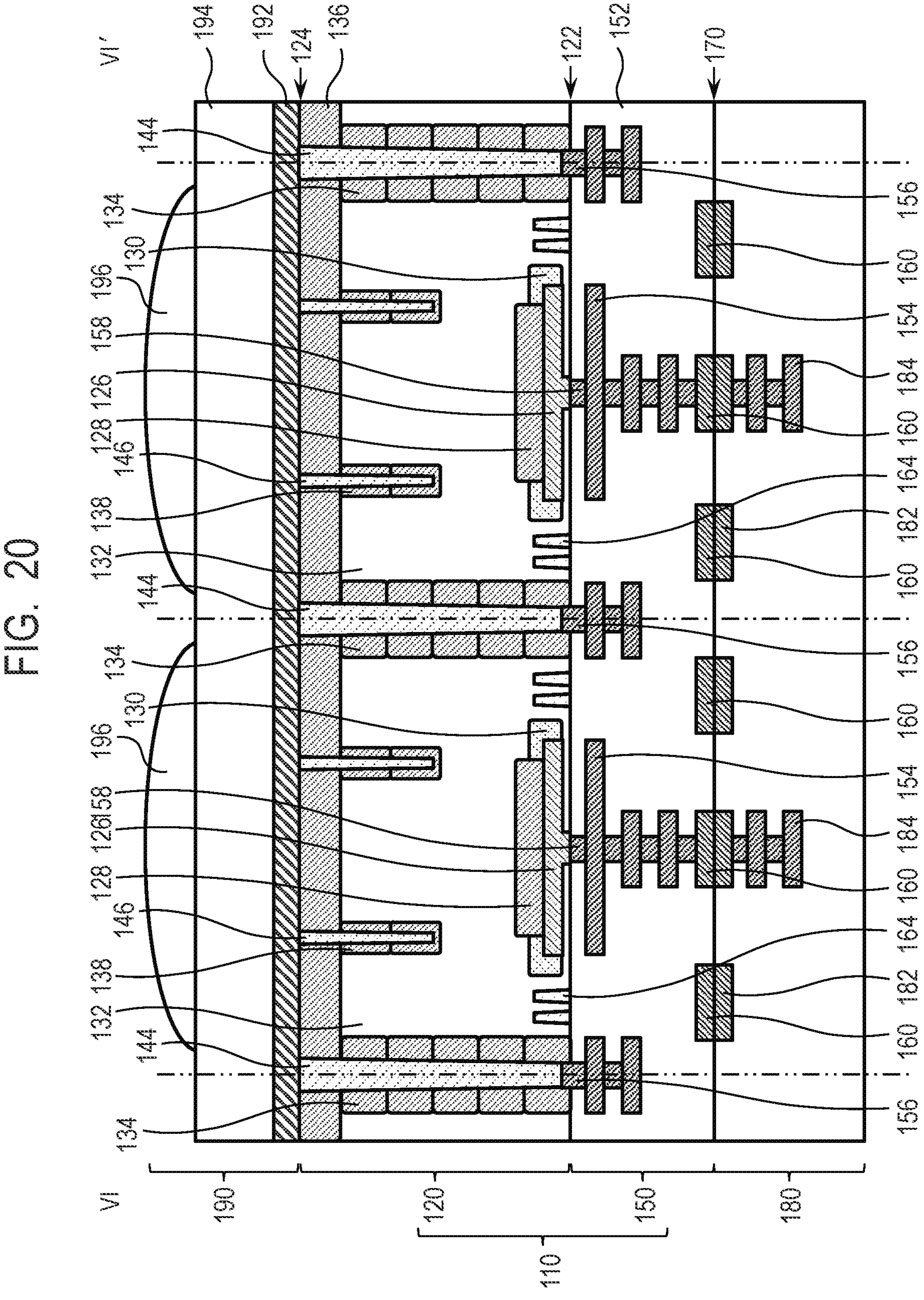
FIG. 20 is a schematic cross-sectional view illustrating a structure of a photoelectric conversion element in a photoelectric conversion device according to an eighth embodiment of the present disclosure.

A photoelectric conversion device according to an eighth embodiment of the present disclosure will be described with reference to FIG. 20. Components similar to those of the photoelectric conversion devices according to the first to seventh embodiments are denoted by the same reference numerals, and descriptions thereof will be omitted or simplified. FIG. 20 is a cross-sectional view illustrating a structure of a photoelectric conversion element in the photoelectric conversion device according to the present embodiment. The planar layout of the photoelectric conversion element of the present embodiment is basically the same as the planar layout of the photoelectric conversion element of the first embodiment illustrated in FIG. 6. FIG. 20 corresponds to a cross-sectional view taken along the line VI-VI' of FIG. 6.

The photoelectric conversion device according to the present embodiment is the same as the photoelectric conversion device according to the first embodiment except that the configuration of the photoelectric conversion element 22 is different. In the present embodiment, portions of the photoelectric conversion element 22 of the present embodiment which are different from the photoelectric conversion element 22 of the first embodiment will be mainly described, and a description of portions common to the photoelectric conversion element 22 of the first embodiment will be appropriately omitted.

The photoelectric conversion element 22 of the present embodiment is different from the photoelectric conversion element of the first embodiment in that the photoelectric conversion element 22 further includes a concave-convex structure 164 on a side of the first face 122 of the semiconductor layer 120. As illustrated in FIG. 20, the concave-convex structure 164 is provided between the n-type semiconductor regions 126 and 130 and the light guide structure 144 on the side of the first face 122 of the semiconductor layer 120. The concave-convex structure 164 may be formed, for example, by burying an insulating member in a groove formed in the first face 122 of the semiconductor layer 120.

By providing the concave-convex structure 164 on the side of the first face 122 of the semiconductor layer 120, it is possible to scatter light that has reached a region away from the avalanche multiplication region of the first face 122 without being absorbed by the semiconductor layer 120. Then, a part of the light scattered by the concave-convex structure 164 causes photoelectric conversion in the vicinity of the avalanche multiplication region, whereby the light receiving sensitivity may be improved.

As described above, according to the present embodiment, charges generated by photoelectric conversion may be efficiently guided to the avalanche multiplication region to improve the light receiving sensitivity.

Ninth Embodiment

Figure 21:
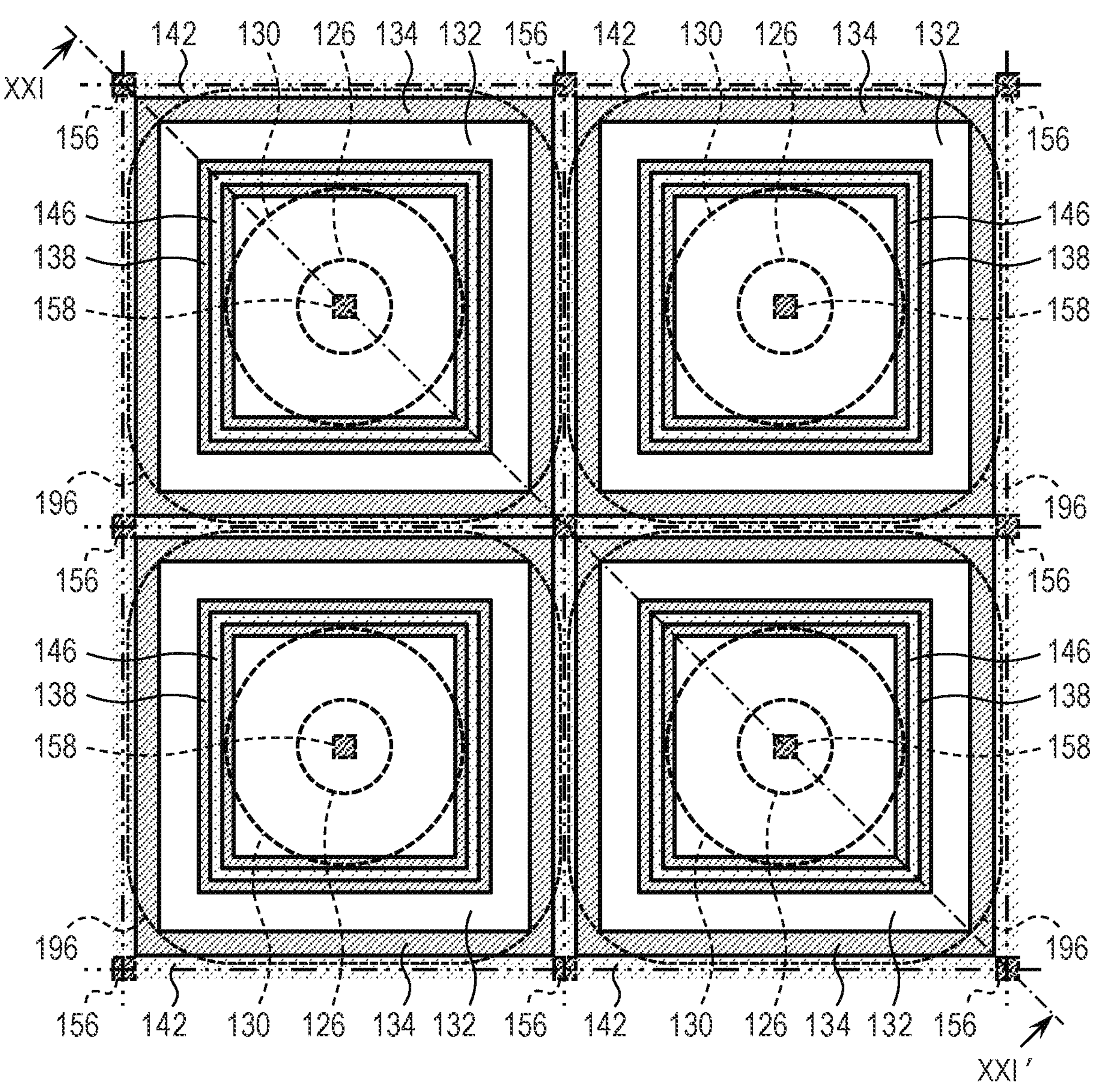
FIG. 21 is a plan view illustrating a structure of a photoelectric conversion element in a photoelectric conversion device according to a ninth embodiment of the present disclosure.
Figure 22:
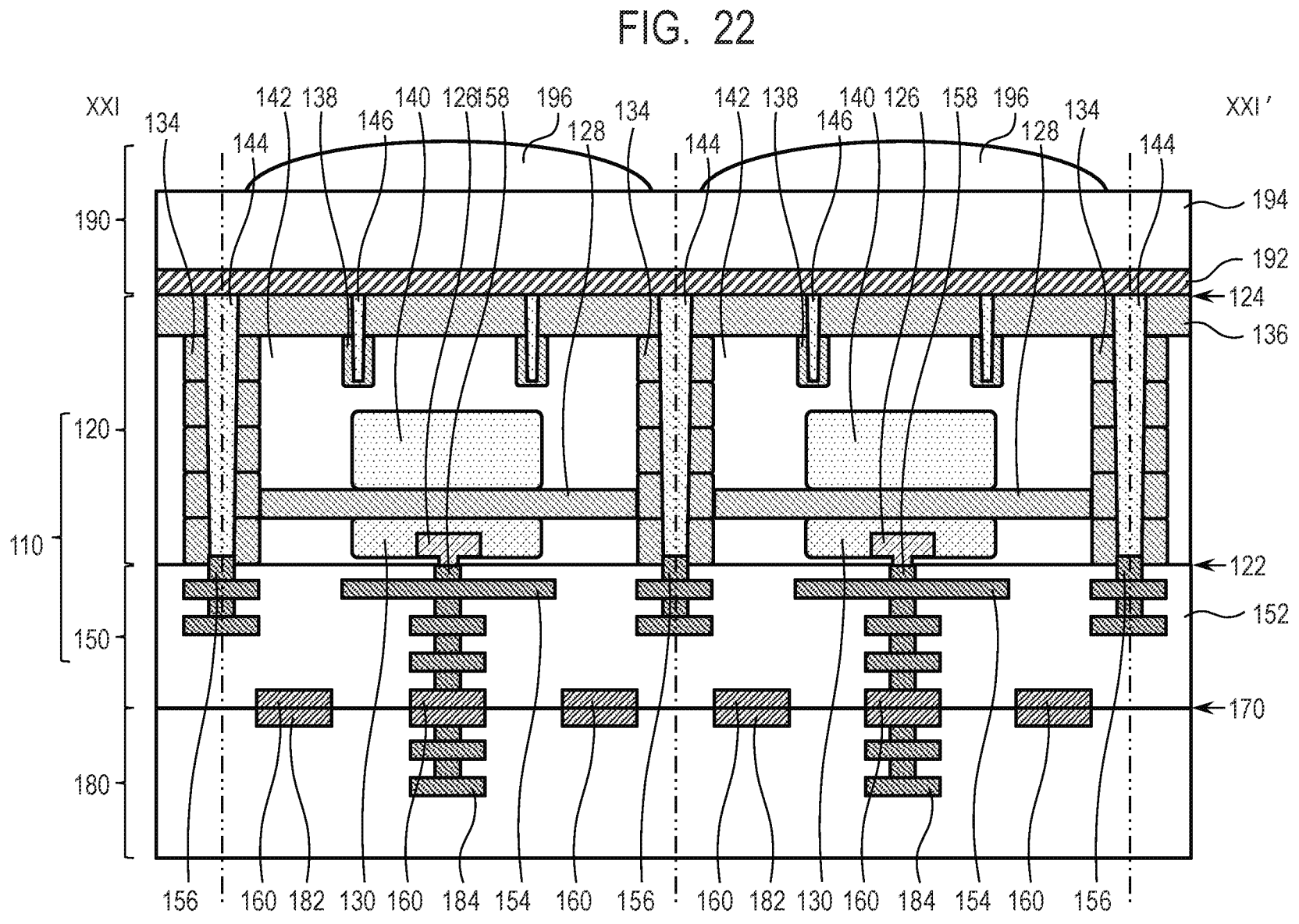

A photoelectric conversion device according to a ninth embodiment of the present disclosure will be described with reference to FIG. 21 and FIG. 22. Components similar to those of the photoelectric conversion devices according to the first to eighth embodiments are denoted by the same reference numerals, and descriptions thereof will be omitted or simplified. FIG. 21 is a plan view illustrating a structure of a photoelectric conversion element in the photoelectric conversion device according to the present embodiment. FIG. 22 is a cross-sectional view illustrating a structure of the photoelectric conversion element in the photoelectric conversion device according to the present embodiment.

The photoelectric conversion device according to the present embodiment is the same as the photoelectric conversion device according to the first embodiment except that the configuration of the photoelectric conversion element 22 is different. In the present embodiment, portions of the photoelectric conversion element 22 of the present embodiment which are different from the photoelectric conversion element 22 of the first embodiment will be mainly described, and a description of portions common to the photoelectric conversion element 22 of the first embodiment will be appropriately omitted.

The configuration of the semiconductor region constituting the photoelectric conversion element 22 is not limited to the examples described in the first to eighth embodiments. The present embodiment describes an example in which a so-called charge collection-type SPAD configuration is applied. FIG. 21 illustrates the positional relationship of the components of the photoelectric conversion element 22 in a plan view. FIG. 21 illustrates four photoelectric conversion elements 22 of four pixels 12 of 2 rows×2 columns arranged next to each other among the plurality of pixels 12 constituting the pixel region 10. FIG. 22 is a cross-sectional view taken along the line XXI-XXI' of FIG. 21.

The semiconductor layer 120 includes an n-type semiconductor regions 126, 130, 140 and 142 and a p-type semiconductor regions 128, 134, 136 and 138. The n-type semiconductor region 126 is disposed on a side of the first face 122 of the semiconductor layer 120 in a cross-sectional view, and at least a part of the n-type semiconductor region 126 reaches the first face 122 of the semiconductor layer 120. The n-type semiconductor region 130 is disposed in contact with the side surface and the side of the second face 124 of the n-type semiconductor region 126. The p-type semiconductor region 128 is disposed closer to the second face 124 of the semiconductor layer 120 than the n-type semiconductor regions 126 and 130, and forms a p-n junction with the n-type semiconductor regions 126 and 130. The n-type semiconductor region 140 is disposed closer to the second face 124 of the semiconductor layer 120 than the p-type semiconductor region 128. The p-type semiconductor region 136 is disposed on the side of the second face 124 of the semiconductor layer 120 in the cross-sectional view. The p-type semiconductor region 136 is provided over the entire region where the photoelectric conversion element 22 is disposed in the plan view. The p-type semiconductor region 134 is disposed so as to surround each of the regions provided with the n-type semiconductor regions 126, 130, and 140 and the p-type semiconductor region 128 in the plan view. The p-type semiconductor region 134 is disposed from the first face 122 of the semiconductor layer 120 to a depth at which the p-type semiconductor region 136 is disposed. A region in the semiconductor layer 120 surrounded by the p-type semiconductor regions 134 and 136 is a well region (n-type semiconductor region 142) in which the n-type semiconductor regions 126, 130 and 140 and the p-type semiconductor region 128 of one photoelectric conversion element 22 are arranged. The impurity concentration of the n-type semiconductor region 142 is lower than the impurity concentration of the n-type semiconductor regions 126, 130, and 140.

In the plan view, the outer peripheral portion of the n-type semiconductor region 130 is separated from the p-type semiconductor region 134. At a depth at which the n-type semiconductor region 126 is disposed, the n-type semiconductor region 142 is disposed between the p-type semiconductor region 134 and the n-type semiconductor region 130, and the n-type semiconductor region 130 is disposed between the n-type semiconductor region 142 and the n-type semiconductor region 126. In the plan view, the outer peripheral portion of the p-type semiconductor region 128 is in contact with the p-type semiconductor region 134. In addition, in the plan view, the outer peripheral portions of the n-type semiconductor regions 130 and 140 are separated from the p-type semiconductor region 134. The n-type semiconductor region 142 is disposed between the p-type semiconductor region 134 and the n-type semiconductor region 140 at a depth at which the n-type semiconductor region 140 is disposed. By configuring the photoelectric conversion element 22 in this manner, an electric field may be formed in the semiconductor layer 120 such that charges generated by photoelectric conversion move in the center direction of the photoelectric conversion element 22 in the plan view and then move to the avalanche multiplication region.

If the miniaturization of the pixel 12 progresses and the distance between the n-type semiconductor region 126 and the p-type semiconductor region 134 decreases, a strong electric field tends to be generated between the n-type semiconductor region 126 and the p-type semiconductor region 134, and there is a concern that noise increases due to a tunnel current. Therefore, it is necessary to reduce the size of the n-type semiconductor region 126 as the pixel 12 is miniaturized, and the effect of collecting charges generated by photoelectric conversion may be reduced.

In this regard, in the present embodiment, since the impurity profile is configured to collect charges in the center portion of the photoelectric conversion element 22, charges may be efficiently collected in the avalanche multiplication region together with the provision of the light guide structure 144 and the light guide structure 146. Thus, the light receiving sensitivity of the photoelectric conversion element 22 may be improved while the pixel 12 is miniaturized.

As described above, according to the present embodiment, charges generated by photoelectric conversion may be efficiently guided to the avalanche multiplication region to improve the light receiving sensitivity.

Tenth Embodiment

A photodetection system according to a tenth embodiment of the present disclosure will be described with reference to FIG. 23. FIG. 23 is a block diagram illustrating a schematic configuration of the photodetection system according to the present embodiment. In the present embodiment, a photodetection sensor to which the photoelectric conversion device 100 described in any of the first to ninth embodiments is applied will be described.

The photoelectric conversion device 100 described in the first to ninth embodiments may be applied to various photodetection systems. Examples of applicable photodetection systems include imaging systems such as digital still cameras, digital camcorders, surveillance cameras, copying machines, facsimiles, mobile phones, on-vehicle cameras, observation satellites, and the like. A camera module including an optical system such as a lens and an imaging device is also included in the photodetection system. FIG. 23 is a block diagram of a digital still camera as an example of these.

The photodetection system 200 illustrated in FIG. 23 includes a photoelectric conversion device 201, a lens 202 for forming an optical image of an object on the photoelectric conversion device 201, an aperture 204 for varying the amount of light passing through the lens 202, and a barrier 206 for protecting the lens 202. The lens 202 and the aperture 204 are optical systems for focusing light on the photoelectric conversion device 201. The photoelectric conversion device 201 is the photoelectric conversion device 100 described in any of the first to ninth embodiments, and converts the optical image formed by the lens 202 into image data.

The photodetection system 200 also includes a signal processing unit 208 that processes an output signal output from the photoelectric conversion device 201. The signal processing unit 208 generates image data from the digital signal output from the photoelectric conversion device 201. The signal processing unit 208 performs various corrections and compressions as necessary to output image data. The photoelectric conversion device 201 may include an AD (Analog to Digital) conversion unit that generates a digital signal to be processed by the signal processing unit 208. The AD conversion unit may be formed on a semiconductor layer (semiconductor substrate) on which the photoelectric conversion element of the photoelectric conversion device 201 is formed, or may be formed on a semiconductor layer different from the semiconductor layer on which the photoelectric conversion element of the photoelectric conversion device 201 is formed. The signal processing unit 208 may be formed on the same semiconductor layer as the photoelectric conversion device 201.

The photodetection system 200 further includes a memory unit 210 for temporarily storing image data, and an external interface unit (external I/F unit) 212 for communicating with an external computer or the like. Further, the photodetection system 200 includes a storage medium 214 such as a semiconductor memory for storing or reading out captured image data, and a storage medium control interface unit (storage medium control I/F unit) 216 for storing or reading out image data on or from the storage medium 214. The storage medium 214 may be built in the photodetection system 200, or may be detachable. Further, communication between the storage medium control I/F unit 216 and the storage medium 214 and communication from the external I/F unit 212 may be performed wirelessly.

Further, the photodetection system 200 includes a general control/operation unit 218 that controls various calculations and the entire digital still camera, and a timing generation unit 220 that outputs various timing signals to the photoelectric conversion device 201 and the signal processing unit 208. Here, the timing signal or the like may be input from the outside, and the photodetection system 200 may include at least the photoelectric conversion device 201 and the signal processing unit 208 that processes an output signal output from the photoelectric conversion device 201. The timing generation unit 220 may be mounted on the photoelectric conversion device 201. Further, the general control/operation unit 218 and the timing generation unit 220 may be configured to implement some or all of the control functions of the photoelectric conversion device 201.

The photoelectric conversion device 201 outputs an imaging signal to the signal processing unit 208. The signal processing unit 208 performs predetermined signal processing on the imaging signal output from the photoelectric conversion device 201, and outputs image data. The signal processing unit 208 generates an image using the imaging signal. The signal processing unit 208 may be configured to perform a distance measurement operation on a signal output from the photoelectric conversion device 201.

As described above, according to the present embodiment, by configuring the photodetection system using the photoelectric conversion devices according to the first to ninth embodiments, it is possible to realize a photodetection system capable of obtaining a higher quality image.

Eleventh Embodiment

A range image sensor according to an eleventh embodiment of the present disclosure will be described with reference to FIG. 24. FIG. 24 is a block diagram illustrating a schematic configuration of the range image sensor according to the present embodiment. In the present embodiment, a range image sensor will be described as an example of a photodetection system to which the photoelectric conversion device 100 described in any of the first to ninth embodiments is applied.

As illustrated in FIG. 24, the range image sensor 300 according to the present embodiment may include an optical system 302, a photoelectric conversion device 304, an image processing circuit 306, a monitor 308, and a memory 310. The range image sensor 300 receives light (modulated light or pulse light) emitted from the light source device 320 toward an object 330 and reflected by the surface of the object 330, and acquires a distance image corresponding to the distance to the object 330.

The optical system 302 includes one or a plurality of lenses, and has a role of forming an image of image light (incident light) from the object 330 on a light receiving surface (sensor unit) of the photoelectric conversion device 304.

The photoelectric conversion device 304 is the photoelectric conversion device 100 described in any of the first to ninth embodiments, and has a function of generating a distance signal indicating the distance to the object 330 based on the image light from the object 330 and supplying the generated distance signal to the image processing circuit 306.

The image processing circuit 306 has a function of performing image processing for constructing a distance image based on the distance signal supplied from the photoelectric conversion device 304.

The monitor 308 has a function of displaying a distance image (image data) obtained by image processing in the image processing circuit 306. The memory 310 has a function of storing (recording) a distance image (image data) obtained by image processing in the image processing circuit 306.

As described above, according to the present embodiment, by configuring the range image sensor using the photoelectric conversion device according to any of the first to ninth embodiments, it is possible to realize a range image sensor capable of acquiring a distance image including more accurate distance information in conjunction with improvement in characteristics of the pixel 12.

Twelfth Embodiment

Figure 25:
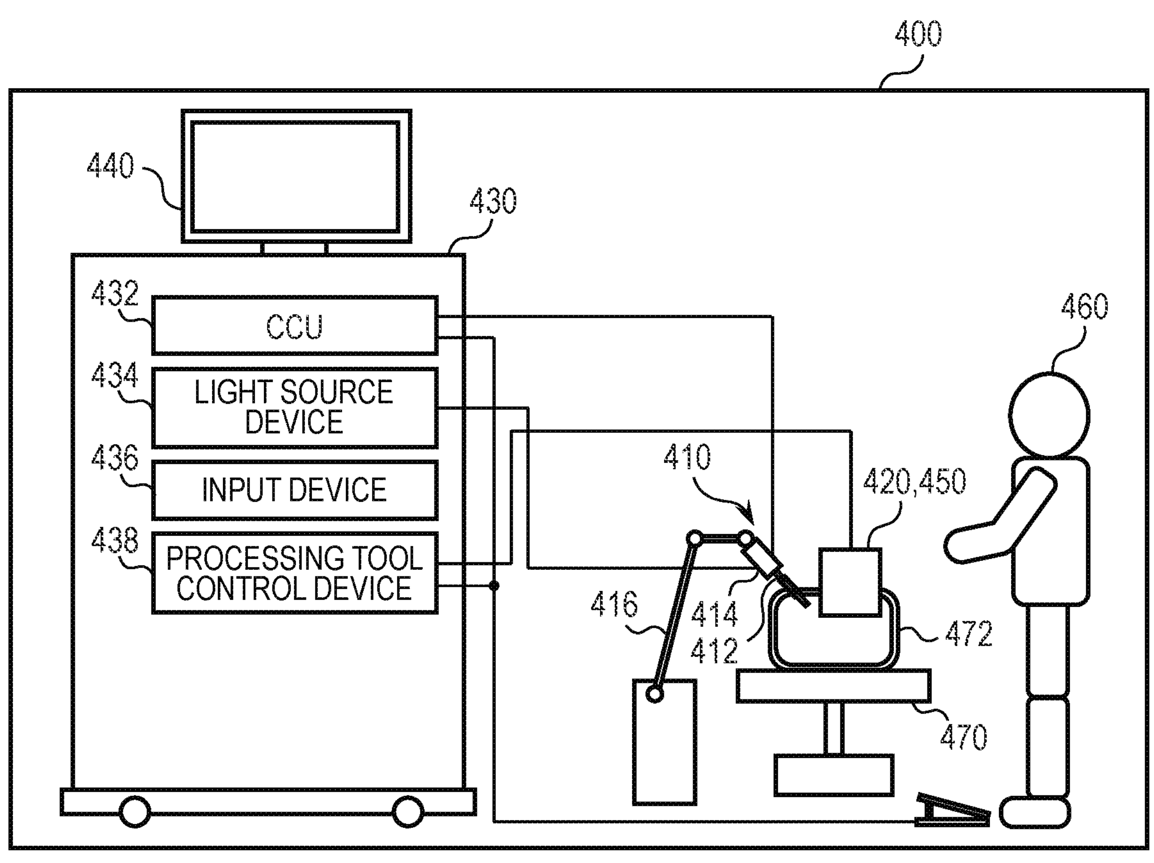
FIG. 25 is a schematic diagram illustrating a configuration example of an endoscopic surgical system according to a twelfth embodiment of the present disclosure.

An endoscopic surgical system according to a twelfth embodiment of the present disclosure will be described with reference to FIG. 25. FIG. 25 is a schematic diagram illustrating a configuration example of the endoscopic surgical system according to the present embodiment. In the present embodiment, an endoscopic surgical system will be described as an example of a photodetection system to which the photoelectric conversion device 100 described in any of the first to ninth embodiments is applied.

FIG. 25 illustrates a state in which an operator (surgeon) 460 performs a surgery on a patient 472 on a patient bed 470 using an endoscopic surgical system 400.

As illustrated in FIG. 25, the endoscopic surgical system 400 according to the present embodiment may include an endoscope 410, a surgical tool 420, and a cart 430 on which various devices for endoscopic surgery are mounted. The cart 430 may include a CCU (Camera Control Unit) 432, a light source device 434, an input device 436, a processing tool control device 438, a display device 440, and the like.

The endoscope 410 includes a lens barrel 412 in which an area of a predetermined length from the tip is inserted into the body cavity of the patient 472, and a camera head 414 connected to the base end of the lens barrel 412. Although FIG. 25 illustrates an endoscope 410 configured as a rigid mirror having a rigid lens barrel 412, the endoscope 410 may be configured as a flexible mirror having a flexible lens barrel. The endoscope 410 is held in a movable state by an arm 416.

An opening into which the objective lens is fitted is provided at the tip of the lens barrel 412. The light source device 434 is connected to the endoscope 410, and light generated by the light source device 434 is guided to the tip of the lens barrel 412 by a light guide extended inside the lens barrel 412, and is irradiated to an observation target in the body cavity of the patient 472 via an objective lens. The endoscope 410 may be a direct viewing mirror, an oblique-viewing mirror, or a side-viewing mirror.

An optical system and a photoelectric conversion device (not illustrated) are provided inside the camera head 414, and reflected light (observation light) from the observation target is focused on the photoelectric conversion device by the optical system. The photoelectric conversion device photoelectrically converts the observation light and generates an electric signal corresponding to the observation light, i.e., an image signal corresponding to the observation image. As the photoelectric conversion device, the photoelectric conversion device 100 described in any of the first to ninth embodiments may be used. The image signal is transmitted to the CCU 432 as RAW data.

The CCU 432 is configured by a CPU (Central Processing Unit), a GPU (Graphics Processing Unit), and the like, and integrally controls the operation of the endoscope 410 and the display device 440. Further, the CCU 432 receives an image signal from the camera head 414, and performs various types of image processing for displaying an image based on the image signal, such as development processing (demosaic processing), on the image signal.

The display device 440 displays an image based on the image signal subjected to the image processing by the CCU 432 under the control of the CCU 432.

The light source device 434 is configured by, for example, a light source such as an LED (Light Emitting Diode), and supplies irradiation light to the endoscope 410 when capturing an image of a surgical part or the like.

The input device 436 is an input interface for the endoscopic surgical system 400. The user may input various kinds of information and instructions to the endoscopic surgical system 400 via the input device 436.

The processing tool control device 438 controls the actuation of the energy processing tool 450 for tissue ablation, incision or blood vessel sealing, etc.

The light source device 434 for supplying the irradiation light to the endoscope 410 when capturing an image of the surgical part may be composed of a white light source composed of, for example, an LED, a laser light source, or a combination thereof. When a white light source is constituted by a combination of RGB laser light sources, since the output intensity and output timing of each color (each wavelength) may be controlled with high accuracy, the white balance of the captured image may be adjusted in the light source device 434. In this case, the observation object is irradiated with the laser light from each of the RGB laser light sources in a time division manner, and the driving of the imaging element of the camera head 414 is controlled in synchronization with the irradiation timing, whereby the images corresponding to the RGB light sources may be captured in a time division manner. According to this method, a color image may be obtained without providing a color filter in the imaging element.

Further, the driving of the light source device 434 may be controlled so as to change the intensity of the output light every predetermined time. By controlling the driving of the imaging element of the camera head 414 in synchronization with the timing of changing the intensity of the light to acquire images in a time-division manner and composing the images, it is possible to generate an image in a high dynamic range without so-called blocked up shadows and blown out highlights.

The light source device 434 may be configured to be capable of supplying light in a predetermined wavelength band corresponding to the special light observation. In the special light observation, for example, wavelength dependency of light absorption in body tissue is utilized. Specifically, a predetermined tissue such as a blood vessel in the surface layer of the mucosa is imaged with high contrast by irradiating light in a narrower band compared to the irradiation light (i.e., white light) during normal observation. Alternatively, in the special light observation, fluorescence observation for obtaining an image by fluorescence generated by irradiation with excitation light may be performed. In the fluorescence observation, the body tissue may be irradiated with excitation light to observe fluorescence from the body tissue, or a reagent such as indocyanine green (ICG) may be locally poured into the body tissue, and the body tissue may be irradiated with excitation light corresponding to the fluorescence wavelength of the reagent to obtain a fluorescence image. The light source device 434 may be configured to supply narrowband light and/or excitation light corresponding to such special light observation.

As described above, according to the present embodiment, by configuring the endoscopic surgical system using the photoelectric conversion device according to the first to ninth embodiments, it is possible to realize an endoscopic surgical system capable of acquiring images of better quality.

Thirteenth Embodiment

Figure 26A:
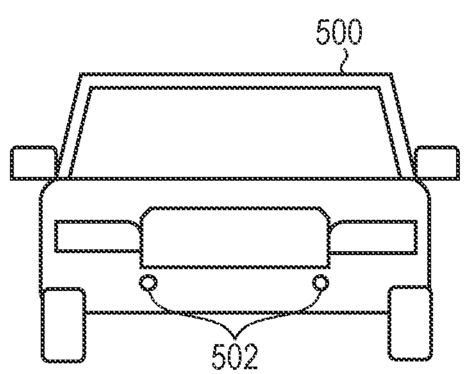
FIG. 26A, FIG. 26B, and FIG. 26C are schematic diagrams illustrating a configuration example of a movable object according to a thirteenth embodiment of the present disclosure.
Figure 26B:
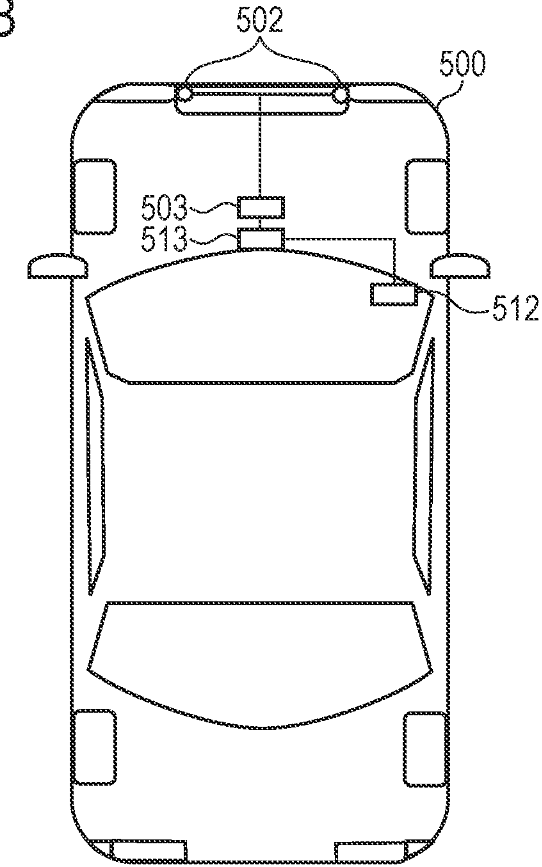
Figure 26C:
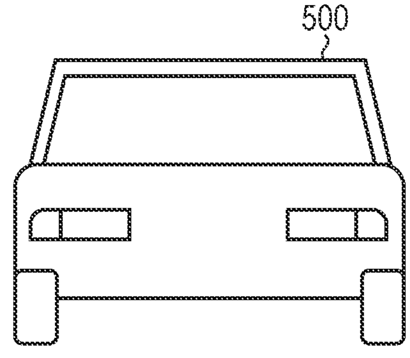
Figure 27:
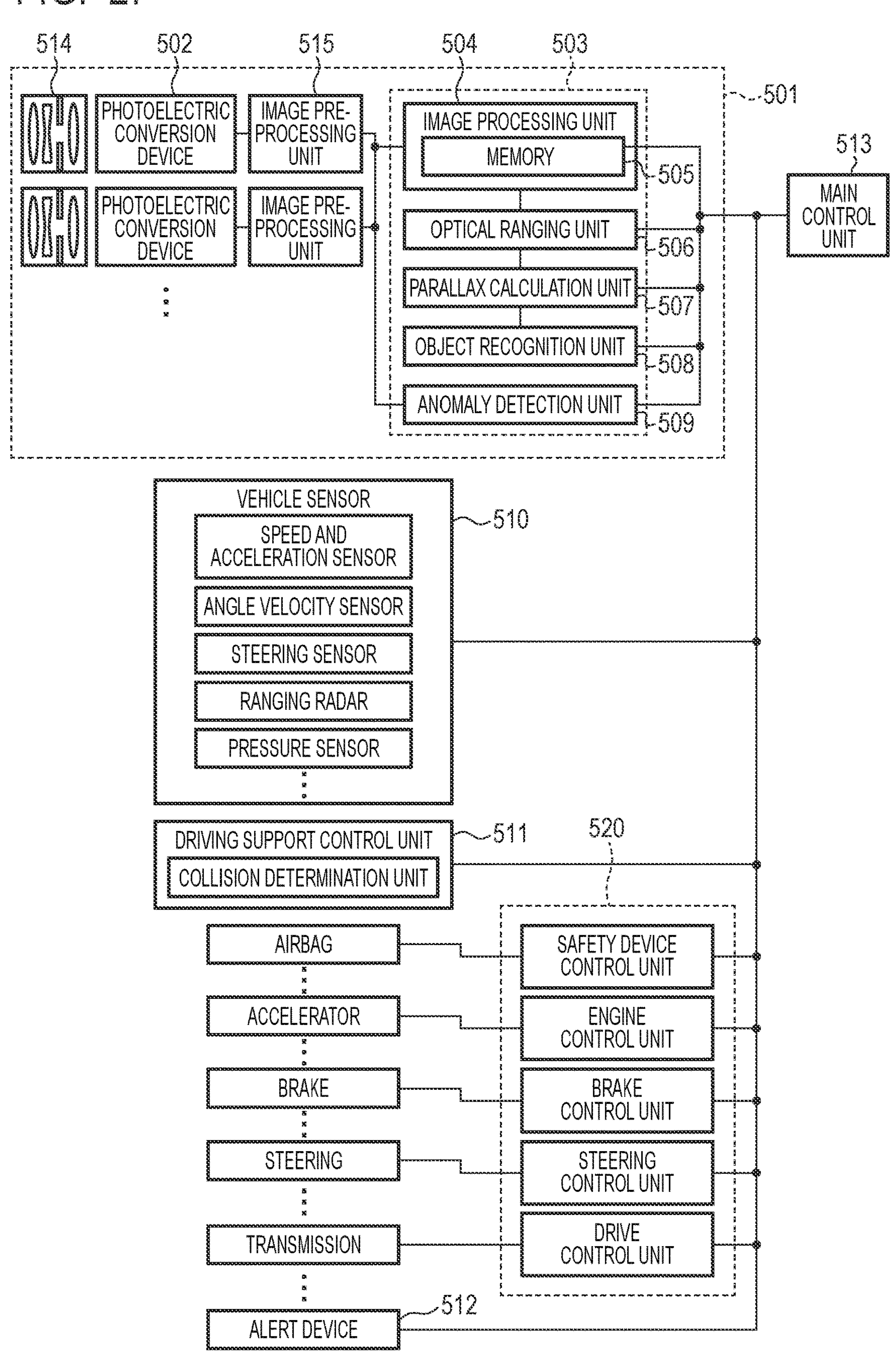
FIG. 27 is a block diagram illustrating a schematic configuration of a photodetection system according to the thirteenth embodiment of the present disclosure.
Figure 28:
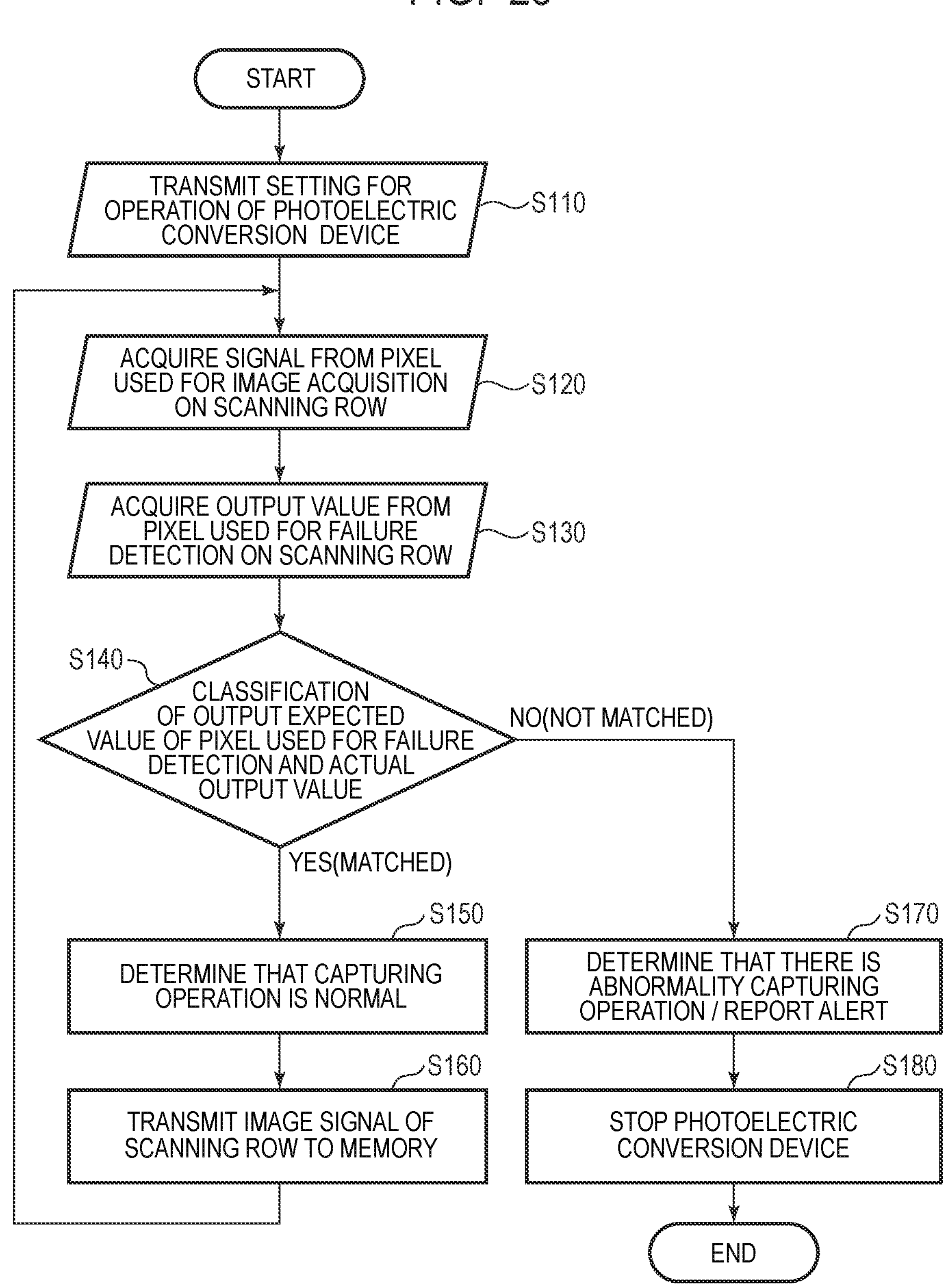
FIG. 28 is a flowchart illustrating the operation of the photodetection system according to the thirteenth embodiment of the present disclosure.

A photodetection system and a movable object according to a thirteenth embodiment of the present disclosure will be described with reference to FIG. 26A to FIG. 28. FIG. 26A to FIG. 26C are schematic diagrams illustrating a configuration example of a movable object according to the present embodiment. FIG. 27 is a block diagram illustrating a schematic configuration of the photodetection system according to the present embodiment. FIG. 28 is a flowchart illustrating an operation of the photodetection system according to the present embodiment. In the present embodiment, an application example to an on-vehicle camera will be described as a photodetection system to which the photoelectric conversion device 100 described in any of the first to ninth embodiments is applied.

FIG. 26A to FIG. 26C are schematic diagrams illustrating a configuration example of a movable object (a vehicle system) according to the present embodiment. FIG. 26A to FIG. 26C illustrate a configuration of a vehicle 500 (an automobile) as an example of a vehicle system incorporating a photodetection system to which the photoelectric conversion device according to any of the first to ninth embodiments is applied. FIG. 26A is a schematic front view of the vehicle 500, FIG. 26B is a schematic plan view of the vehicle 500, and FIG. 26C is a schematic rear view of the vehicle 500. The vehicle 500 includes a pair of photoelectric conversion devices 502 on the front side thereof. Here, the photoelectric conversion devices 502 are the photoelectric conversion device 100 described in any of the first to ninth embodiments. The vehicle 500 includes an integrated circuit 503, an alert device 512, and a main control unit 513.

FIG. 27 is a block diagram illustrating a configuration example of a photodetection system 501 mounted on the vehicle 500. The photodetection system 501 includes a photoelectric conversion device 502, an image preprocessing unit 515, an integrated circuit 503, and an optical system 514. The photoelectric conversion device 502 is the photoelectric conversion device 100 described in any of the first to ninth embodiments. The optical system 514 forms an optical image of an object on the photoelectric conversion device 502. The photoelectric conversion device 502 converts the optical image of the object formed by the optical system 514 into an electric signal. The image preprocessing unit 515 performs predetermined signal processing on the signal output from the photoelectric conversion device 502. The function of the image preprocessing unit 515 may be incorporated in the photoelectric conversion device 502. The photodetection system 501 is provided with at least two sets of the optical system 514, the photoelectric conversion device 502, and the image preprocessing unit 515, and outputs from the image preprocessing units 515 of each set are input to the integrated circuit 503.

The integrated circuit 503 is an integrated circuit for use in an imaging system, and includes an image processing unit 504, an optical ranging unit 506, a parallax calculation unit 507, an object recognition unit 508, and an abnormality detection unit 509. The image processing unit 504 processes the image signal output from the image preprocessing unit 515. For example, the image processing unit 504 performs image processing such as development processing and defect correction on the output signal of the image preprocessing unit 515. The image processing unit 504 includes a memory 505 for temporarily storing image signals. The memory 505 may store, for example, the position of a known defective pixel in the photoelectric conversion device 502.

The optical ranging unit 506 performs focusing and distance measurement of the object. The parallax calculation unit 507 calculates distance measurement information (distance information) from a plurality of image data (parallax images) acquired by the plurality of photoelectric conversion devices 502. Each of the photoelectric conversion devices 502 may have a configuration capable of acquiring various kinds of information such as distance information. The object recognition unit 508 recognizes an object such as a vehicle, a road, a sign, or a person. When the abnormality detection unit 509 detects an abnormality of the photoelectric conversion device 502, the abnormality detection unit 509 notifies the main control unit 513 of the abnormality.

The integrated circuit 503 may be implemented by dedicated hardware, software modules, or a combination thereof. Further, it may be implemented by FPGA (Field Programmable Gate Array), ASIC (Application Specific Integrated Circuit), or the like, or may be implemented by a combination of these.

The main control unit 513 collectively controls the operations of the photodetection system 501, the vehicle sensor 510, the control unit 520, and the like. The vehicle 500 may not include the main control unit 513. In this case, the photoelectric conversion device 502, the vehicle sensor 510, and the control unit 520 transmit and receive control signals via a communication network. For example, the CAN (Controller Area Network) standard may be applied to transmit and receive the control signals.

The integrated circuit 503 has a function of receiving a control signal from the main control unit 513 or transmitting a control signal and a setting value to the photoelectric conversion device 502 by its own control unit.

The photodetection system 501 is connected to the vehicle sensor 510, and may detect a traveling state of the own vehicle such as a vehicle speed, a yaw rate, a steering angle, and the like, an environment outside the own vehicle, and states of other vehicles and obstacles. The vehicle sensor 510 is also a distance information acquisition means for acquiring distance information to the object. The photodetection system 501 is connected to a driving support control unit 511 that performs various driving support functions such as an automatic steering function, an automatic cruising function, and a collision prevention function. In particular, with regard to the collision determination function, based on the detection results of the photodetection system 501 and the vehicle sensor 510, it is determined whether or not there is a collision with another vehicle or an obstacle. Thus, avoidance control when a collision is estimated and activation of the safety device at the time of collision are performed.

The photodetection system 501 is also connected to an alert device 512 that issues an alert to the driver based on the determination result of the collision determination unit. For example, when the collision possibility is high as the determination result of the collision determination unit, the main control unit 513 performs vehicle control to avoid collision and reduce damage by braking, returning an accelerator, suppressing engine output, or the like. The alert device 512 alerts a user by sounding an alarm such as a sound, displaying alert information on a display screen of a car navigation system or a meter panel, or applying vibration to a seat belt or a steering wheel.

In the present embodiment, the photodetection system 501 images the periphery of the vehicle, for example, the front side or the rear side. FIG. 26B illustrates an example of the arrangement of the photodetection system 501 when the photodetection system 501 captures an image in front of the vehicle.

As described above, the photoelectric conversion device 502 is disposed in front of the vehicle 500. More specifically, when a center line with respect to a forward/backward direction of the vehicle 500 or an outer shape (e.g., a vehicle width) is regarded as a symmetry axis, and two photoelectric conversion devices 502 are disposed axisymmetrically with respect to the symmetry axis, it is preferable to acquire distance information between the vehicle 500 and an object to be imaged and to determine a collision possibility. Further, it is preferable that the photoelectric conversion device 502 is disposed so as not to obstruct the field of view of the driver when the driver sees a situation outside the vehicle 500 from the driver's seat. The alert device 512 is preferably arranged to be easy to enter the field of view of the driver.

Next, a failure detection operation of the photoelectric conversion device 502 in the photodetection system 501 will be described with reference to FIG. 28. The failure detection operation of the photoelectric conversion device 502 may be performed according to steps S110 to S180 illustrated in FIG. 28.

Step S110 is a step of performing setting at the time of startup of the photoelectric conversion device 502. That is, a setting for the operation of the photoelectric conversion device 502 is transmitted from the outside of the photodetection system 501 (for example, the main control unit 513) or from the inside of the photodetection system 501, and the imaging operation and the failure detection operation of the photoelectric conversion device 502 are started.

Next, in step S120, pixel signals are acquired from the effective pixels. In step S130, an output value from the failure detection pixel provided for failure detection is acquired. The failure detection pixel includes a photoelectric conversion element as in the case of the effective pixel. A predetermined voltage is written to the photoelectric conversion element. The failure detection pixel outputs a signal corresponding to the voltage written to the photoelectric conversion element. Step S120 and step S130 may be reversed.

Next, in step S140, a classification of the output expected value of the failure detection pixel and the actual output value from the failure detection pixel is performed. As a result of the classification in step S140, when the output expected value matches the actual output value, the process proceeds to step S150, it is determined that the imaging operation is normally performed, and the process proceeds to step S160. In step S160, the pixel signals of the scanning row are transmitted to the memory 505 to temporarily store them. After that, the process returns to step S120 to continue the failure detection operation. On the other hand, as a result of the classification in step S140, when the output expected value does not match the actual output value, the processing step proceeds to step S170. In step S170, it is determined that there is an abnormality in the imaging operation, and an alert is notified to the main control unit 513 or the alert device 512. The alert device 512 causes the display unit to display that an abnormality has been detected. Thereafter, in step S180, the photoelectric conversion device 502 is stopped, and the operation of the photodetection system 501 is terminated.

Although the present embodiment exemplifies the example in which the flowchart is looped for each row, the flowchart may be looped for each plurality of rows, or the failure detection operation may be performed for each frame. The alert of step S170 may be notified to the outside of the vehicle via the wireless network.

Further, in the present embodiment, the control in which the own vehicle does not collide with other vehicles has been described, but the present disclosure is also applicable to a control in which the own vehicle is automatically driven following another vehicle, a control in which the own vehicle is automatically driven so as not to go out of the lane, and the like. Further, the photodetection system 501 may be applied not only to a vehicle such as an own vehicle but also to, for example, other movable objects (moving devices) such as a ship, an aircraft, or an industrial robot. In addition, the present disclosure may be applied not only to a movable object but also to equipment using object recognition in a wide range such as an ITS (Intelligent Transport System).

Fourteenth Embodiment

Figure 29A:
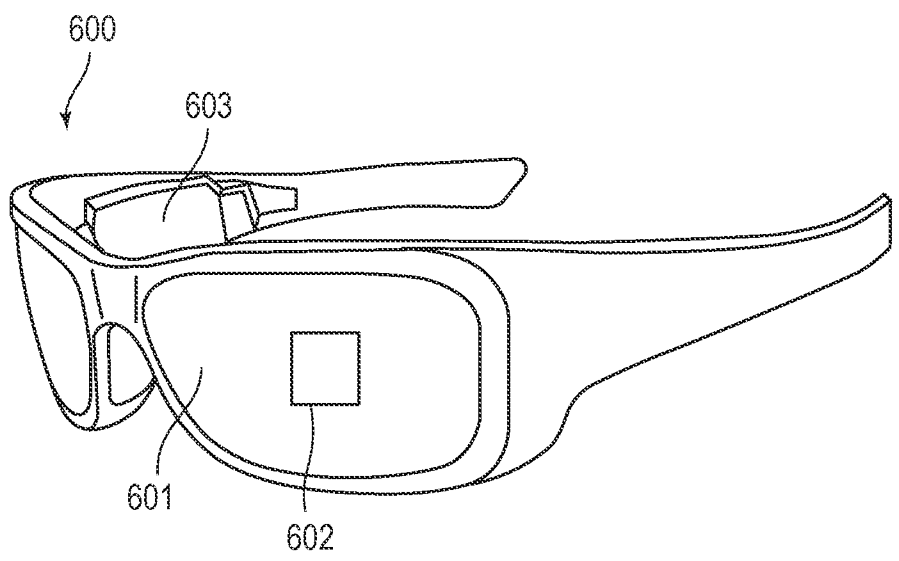
FIG. 29A and FIG. 29B are schematic diagrams illustrating a schematic configuration of a photodetection system according to a fourteenth embodiment of the present disclosure.
Figure 29B:
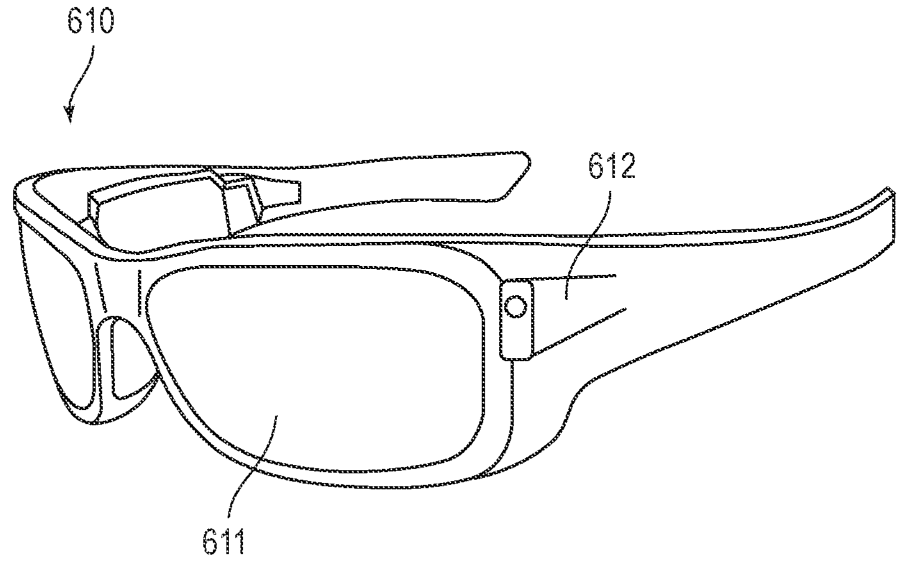

A photodetection system according to a fourteenth embodiment of the present disclosure will be described with reference to FIG. 29A and FIG. 29B. FIG. 29A and FIG. 29B are schematic diagrams illustrating a configuration example of a photodetection system according to the present embodiment. In the present embodiment, an application example to eyeglasses (smartglasses) will be described as a photodetection system to which the photoelectric conversion device 100 described in any of the first to ninth embodiments is applied.

FIG. 29A illustrates eyeglasses 600 (smartglasses) according to one application example. The eyeglasses 600 include lenses 601, a photoelectric conversion device 602, and a control device 603.

The photoelectric conversion device 602 is the photoelectric conversion device 100 described in any of the first to ninth embodiments, and is provided on the lens 601. One photoelectric conversion device 602 or a plurality of photoelectric conversion devices 602 may be provided on the lens 601. When a plurality of photoelectric conversion devices 602 is used, a plurality of types of photoelectric conversion devices 602 may be used in combination. The arrangement position of the photoelectric conversion device 602 is not limited to that illustrated in FIG. 29A. A display device (not illustrated) including a light emitting device such as an OLED or an LED may be provided on the rear surface side of the lens 601.

The control device 603 functions as a power supply for supplying power to the photoelectric conversion device 602 and the display device. The control device 603 has a function of controlling the operations of the photoelectric conversion device 602 and the display device. The lens 601 is provided with an optical system for focusing light on the photoelectric conversion device 602.

FIG. 29B illustrates eyeglasses 610 (smartglasses) according to another application example. The eyeglasses 610 include lenses 611 and a control device 612. A photoelectric conversion device corresponding to the photoelectric conversion device 602 and a display device (not illustrated) may be mounted on the control device 612.

The lens 611 is provided with a photoelectric conversion device in the control device 612 and an optical system for projecting light from the display device, and an image is projected thereon. The control device 612 functions as a power supply for supplying power to the photoelectric conversion device and the display device, and has a function of controlling the operations of the photoelectric conversion device and the display device.

The control device 612 may further include a line-of-sight detection unit that detects the line of sight of the wearer. In this case, an infrared light emitting unit is provided in the control device 612, and infrared light emitted from the infrared light emitting unit may be used for detection of a line of sight. Specifically, the infrared light emitting unit emits infrared light to the eyeball of the user who is watching the display image. The reflected light of the emitted infrared light from the eyeball is detected by the imaging unit having the light receiving element, whereby a captured image of the eyeball is obtained. By providing a reduction unit that reduces light from the infrared light emitting unit to the display unit in a plan view, a decrease in image quality may be reduced.

The line of sight of the user with respect to the display image may be detected from the captured image of the eyeball obtained by capturing the infrared light. Any known method may be applied to the line-of-sight detection using the captured image of the eyeball. As an example, a line-of-sight detection method based on a Purkinje image caused by reflection of irradiation light on the cornea may be used. More specifically, a line-of-sight detection processing based on the pupil cornea reflection method is performed. By using the pupil cornea reflection method, a line-of-sight vector representing the direction (rotation angle) of the eyeball is calculated based on the image of the pupil image and the Purkinje image included in the captured image of the eyeball, whereby the line-of-sight of the user is detected.

The display device according to the present embodiment may include a photoelectric conversion device having a light receiving element, and may be configured to control a display image based on line-of-sight information of a user from the photoelectric conversion device. Specifically, the display device determines a first viewing area to be gazed by the user and a second viewing area other than the first viewing area based on the line-of-sight information. The first viewing area and the second viewing area may be determined by a control device of the display device, or may be determined by an external control device. When an external control device determines, the determination result is transmitted to the display device via communication. In the display region of the display device, the display resolution of the first viewing area may be controlled to be higher than the display resolution of the second viewing area. That is, the resolution of the second viewing area may be lower than the resolution of the first viewing area.

Further, the display area may have a first display area and a second display area different from the first display area, and may be configured to determine an area having a high priority from the first display area and the second display area based on the line-of-sight information. The first display area and the second display area may be determined by a control device of the display device, or may be determined by an external control device. When an external control device determines, the determination result is transmitted to the display device via communication. The resolution of the area with high priority may be controlled to be higher than the resolution of the area other than the area with high priority. That is, the resolution of the area having a relatively low priority may be reduced.

An AI (Artificial Intelligence) may be used to determine the first viewing area or the area with high priority. The AI may be a model configured to estimate an angle of a line-of-sight and a distance to a target object ahead of the line-of-sight from an image of an eyeball, using an image of the eyeball and a direction in which the eyeball of the image is actually viewed as teacher data. The AI program may be held by the display device, the photoelectric conversion device, or an external device. When the external device has, the information is transmitted to the display device via communication.

When the display control is performed based on the visual recognition detection, the present disclosure may be preferably applied to smartglasses which further include a photoelectric conversion device for capturing an image of the outside. The smartglasses may display captured external information in real time.

MODIFIED EMBODIMENTS

The present disclosure is not limited to the above-described embodiments, and various modifications are possible.

For example, an example in which some of the configurations of any of the embodiments are added to other embodiments or an example in which some of the configurations of any of the embodiments are substituted with some of the configurations of the other embodiments is also an embodiment of the present disclosure.

For example, it is possible to add at least one of the concave-convex structures 148 and 164, the curved reflection layer 162, the light shielding layer 193, the inner-layer lens 195, and the optical waveguide 197 to the photoelectric conversion element 22 of the first to ninth embodiments.

The circuit configuration of the pixel 12 is not limited to the above-described embodiments. For example, a switch such as a transistor may be provided between the photoelectric conversion element 22 and the quenching element 24 or between the photoelectric conversion unit 20 and the pixel signal processing unit 30 to control an electrical connection state therebetween. Further, a switch such as a transistor may be provided between the node to which the voltage VH is supplied and the quenching element 24 and/or between the node to which the voltage VL is supplied and the photoelectric conversion element 22 to control an electrical connection state therebetween. Further, a plurality of photoelectric conversion elements 22 may be provided for one pixel 12.

Although the counter 34 is used as the pixel signal processing unit 30 in the above embodiment, a TDC (Time to Digital Converter) and a memory may be used instead of the counter 34. In this case, the generation timing of the pulse signal output from the signal processing circuit 32 is converted into a digital signal by the TDC. A control pulse pREF (reference signal) is supplied from the vertical scanning circuit unit 40 to the TDC via the control line 14 when the timing of the pulse signal is measured. The TDC acquires a signal indicating a relative time of the input timing of the signal output from each pixel 12 with respect to the control pulse pREF as a digital signal.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2022-142829, filed Sep. 8, 2022 which is hereby incorporated by reference herein in its entirety.

What is claimed is:

1. A photoelectric conversion element provided in a semiconductor layer having a first face and a second face opposed to the first face comprising:

a first semiconductor region of a first conductivity type arranged in the semiconductor layer;

a second semiconductor region of a second conductivity type arranged closer to the second face than the first semiconductor region and forming a p-n junction with the first semiconductor region to form an avalanche photodiode;

a light guide structure arranged in the semiconductor layer and having a first portion disposed so as to surround a first region in a plan view and a second portion disposed so as to surround a second region inside the first region in the plan view; and an optical structure layer disposed on a side of the second face of the semiconductor layer, wherein the second portion is disposed over a depth of at least 0.8 μm from the second face, wherein the first semiconductor region and the second semiconductor region are arranged closer to the first face than the second portion, and wherein the second portion overlaps at least a portion of an avalanche multiplication region between the first semiconductor region and the second semiconductor region in the plan view.

2. The photoelectric conversion element according to claim 1, wherein the first portion and the second portion of the light guide structure are independent of each other.

3. The photoelectric conversion element according to claim 2, wherein at least a portion of the first portion of the light guide structure is provided over a region closer to a side of the first face of the semiconductor layer than the second portion.

4. The photoelectric conversion element according to claim 3, wherein the first portion of the light guide structure is provided from the first face to the second face of the semiconductor layer.

5. The photoelectric conversion element according to claim 1, wherein the first portion disposed on a side of the first face and the second portion disposed on a side of the second face are continuous in a depth direction of the semiconductor layer, and wherein, in a cross-sectional view, a second width of the second portion is larger than a first width of the first portion, and a width of the light guide structure is changed discontinuously from the first width to the second width.

6. The photoelectric conversion element according to claim 1, wherein the semiconductor layer has a concave-convex structure provided on the second face.

7. The photoelectric conversion element according to claim 1, wherein the optical structure layer includes a light shielding layer disposed in a portion of the first region excluding the second region.

8. The photoelectric conversion element according to claim 1, wherein the optical structure layer includes a microlens and is configured to condense incident light to the second region of the semiconductor layer.

9. The photoelectric conversion element according to claim 8, wherein the optical structure layer includes an inner-layer lens disposed between the microlens and the semiconductor layer.

10. The photoelectric conversion element according to claim 8, wherein the optical structure layer includes an optical waveguide disposed between the microlens and the semiconductor layer.

11. The photoelectric conversion element according to claim 1, wherein the second portion has a similar figure with respect to an outline of the avalanche multiplication region or the first portion in a plan view.

12. The photoelectric conversion element according to claim 1, wherein the semiconductor layer has a concave-convex structure provided on the first face.

13. The photoelectric conversion element according to claim 1 further comprising a reflection layer provided opposing to the first face of the semiconductor layer.

14. The photoelectric conversion element according to claim 1 further comprising a third semiconductor layer of the second conductivity type arranged so as to surround the first region in the plan view, wherein the first portion of the light guide structure is disposed inside the third semiconductor region.

15. The photoelectric conversion element according to claim 14 further comprising:

a fourth semiconductor region of the first conductivity type arranged closer to the second face than the second semiconductor region; and a fifth semiconductor region of the first conductivity type arranged between the third semiconductor region and the fourth semiconductor region of a depth at which the fourth semiconductor region is provided, wherein an impurity concentration of the fifth semiconductor region is lower than an impurity concentration of the fourth semiconductor region.

16. The photoelectric conversion element according to claim 1, wherein the first portion of the light guide structure is provided so as to isolate a plurality of the first regions defined in the semiconductor layer from each other.

17. A photoelectric conversion device including a plurality of pixels arranged to form a plurality of rows and a plurality of columns, wherein each of the plurality of pixels includes the photoelectric conversion element according to claim 1 and a signal processing circuit configured to process a signal output from the photoelectric conversion element.

18. The photoelectric conversion device according to claim 17 comprising:

a first substrate including the semiconductor layer provided with the photoelectric conversion element of each of the plurality of pixels; and a second substrate provided with the signal processing circuit of each of the plurality of pixels.

19. A photodetection system comprising:

the photoelectric conversion device according to claim 17; and a signal processing device configured to process a signal output from the photoelectric conversion device.

20. The photodetection system according to claim 19, wherein the signal processing device generates a distance image representing distance information to an object based on the signal.

21. A movable object comprising:

the photoelectric conversion device according to claim 17;

a distance information acquisition unit configured to acquire distance information to an object from a parallax image based on a signal output from the photoelectric conversion device; and a control unit configured to control the movable object based on the distance information.

* * * * *